United States Patent

Yoshitani et al.

[11] Patent Number: 5,975,098
[45] Date of Patent: Nov. 2, 1999

[54] APPARATUS FOR AND METHOD OF CLEANING SUBSTRATE

[75] Inventors: Mitsuaki Yoshitani; Kazuo Kinose; Satoru Tanaka; Kenya Morinishi; Masahiro Miyagi, all of Shiga; Naoshige Itami; Kazuhiro Watanabe, both of Kanagawa, all of Japan

[73] Assignees: Dainippon Screen Mfg. Co., Ltd.; Fujitsu Limited, both of Japan

[21] Appl. No.: 08/775,712

[22] Filed: Dec. 17, 1996

[30] Foreign Application Priority Data

Dec. 21, 1995 [JP] Japan .................................... 7-333120
Dec. 21, 1995 [JP] Japan .................................... 7-333121

[51] Int. Cl.[6] ........................................................ B08B 3/02
[52] U.S. Cl. ...................... 134/148; 134/153; 134/181; 134/198; 134/902; 134/184
[58] Field of Search ..................... 134/148, 153, 134/902, 172, 181, 184, 198; 239/102.2

[56] References Cited

U.S. PATENT DOCUMENTS

| | | | |
|---|---|---|---|
| 4,064,885 | 12/1977 | Dussault et al. | 134/184 |
| 4,326,553 | 4/1982 | Hall | 134/902 |
| 5,100,476 | 3/1992 | Mase et al. | 134/184 |
| 5,186,389 | 2/1993 | Shibano . | |
| 5,368,054 | 11/1994 | Koretsky et al. | 134/902 |
| 5,512,335 | 4/1996 | Miller et al. | 134/186 |
| 5,601,655 | 2/1997 | Bok et al. | 134/902 |

FOREIGN PATENT DOCUMENTS

| | | | |
|---|---|---|---|
| 54-103266 | 8/1979 | Japan | 134/184 |
| 61-181134 | 8/1986 | Japan . | |
| 62-188323 | 8/1987 | Japan | 134/902 |
| 1-105376 | 4/1989 | Japan . | |
| 3-14230 | 1/1991 | Japan | 134/902 |
| 4-213827 | 8/1992 | Japan | 134/902 |
| 5-175184 | 7/1993 | Japan | 134/902 |
| 6-120136 | 4/1994 | Japan | 134/902 |

*Primary Examiner*—Frankie L. Stinson
*Attorney, Agent, or Firm*—Ostrolenk, Faber, Gerb & Soffen, LLP

[57] ABSTRACT

A substrate rinsing apparatus of a non-contact type having a high rinsing ability. An ultrasonic rinsing nozzle and a high-pressure rinsing nozzle are both disposed within the same rinsing apparatus. The ultrasonic rinsing nozzle ejects ultrasonic rinsing liquid as a curtain through a slit, while the high-pressure rinsing nozzle ejects a high-pressure rinsing jet toward the ultrasonic rinsing liquid which is ejected toward a substrate. Not only is foreign matter removed by ultrasonic rinsing, but foregoing matter is removed by the high-pressure rinsing jet and is carried away by a flow of the ultrasonic rinsing liquid and washed off the substrate toward a downstream side of rotation of the substrate.

27 Claims, 23 Drawing Sheets

APPARATUS FOR AND METHOD OF CLEANING SUBSTRATE

BACKGROUND OF THE INVENTION

1. Field of the Invention

The present invention relates to an improved substrate cleaning technique, and more particularly to a technique for enabling both an ability of removing a foreign matter which is on a surface of a substrate and an ability of discharging a removed foreign matter from the surface of the substrate.

2. Description of the Prior Art

As well known, surface processing using various types of processing liquid is performed on a substrate such as a glass substrate for a liquid crystal display apparatus and a semiconductor wafer. Following such processing, it is necessary to remove remaining processing liquid from a substrate. It is also important to remove particles which are adhered to the surface of the substrate. For removal of such a foreign matter, the substrate is subjected to a cleaning process. Cleaning methods are generally divided into chemical cleaning and physical cleaning.

Chemical cleaning includes one using pure water, one using neutral or alkaline cleaning liquid, one using ozone water which is obtained by solving ozone in cleaning liquid, etc. Such chemical cleaning, being based on chemical solving, is effective for removal of a relatively fine foreign matter and a foreign matter which is chemically bonded to a substrate, but is not effective for removal of a relatively large foreign matter. For this reason, physical cleaning is often performed in addition to chemical cleaning.

Meanwhile, there are various types of methods of physical cleaning. As each of the methods has both advantages and disadvantages, sufficient physical cleaning is difficult with one method alone. Hence, in many cases, more than one physical cleaning method are combined to achieve the desired level of cleaning.

Under the circumstance, parallel use of a plurality of physical cleaning methods within one apparatus has been proposed. For example, Japanese Patent Laid Open Official Gazette No. 7-86218 discloses an apparatus which simultaneously performs both a brush-cleaning method with a rotating brush and an ultrasonic cleaning method with ultrasonically vibrated liquid.

Execution of a plurality of cleaning methods within one apparatus as disclosed by Japanese Patent Laid Open Official Gazette No. 7-86218 is related to a time which is needed for cleaning. In other words, as substrates have become larger in recent years, the demand for a shortened cleaning time has been mounting. If cleaning apparatuses of different methods are arranged linearly and cleaning is performed serially by these cleaning apparatuses, the cleaning time which is available for each cleaning apparatus is shortened and therefore its cleaning ability is reduced.

However, such an apparatus for a brush-cleaning method as that disclosed by Japanese Patent Laid Open Official Gazette No. 7-86218 has another problem. That is, although a brush-cleaning method has an excellent ability to remove a foreign matter, as being physical cleaning which requires a physical contact, the method gives damage such as a flaw to a surface of a substrate.

SUMMARY OF THE INVENTION

In accordance with such principles, the present invention is defined as comprising the following means and structures.

<First Invention>

According to a first invention, an apparatus for cleaning a substrate comprises:

a) ultrasonic cleaning means for emitting an ultrasonic wave onto liquid while injecting the liquid toward the substrate so as to perform ultrasonic rinsing on the substrate; and b) high-pressure cleaning means which is disposed at a different position from the ultrasonic cleaning means, the high-pressure cleaning means jetting out high-pressure liquid toward the substrate so as to perform high-pressure rinsing on the substrate, and the substrate cleaning apparatus is structured so as to perform combined rinsing combining the ultrasonic rinsing and the high-pressure rinsing on the substrate.

<Second Invention>

According to a second invention, the substrate cleaning apparatus of the first invention further c) substrate rotating means for rotating the substrate in a predetermined direction, so as to perform the combined rinsing while rotating the substrate. This is an application to a so-called spin scrubber.

<Third Invention>

According to a structure of a third invention, in the substrate cleaning apparatus of the second invention, the ultrasonic cleaning means includes a-1) an ultrasonic rinsing nozzle for injecting the liquid which is subjected to the ultrasonic wave, through a slit, toward an ultrasonic rinsing line which is defined on a surface-to-be-cleaned of the substrate, and the high-pressure cleaning means includes b-1) a high-pressure rinsing nozzle for jetting out high-pressure liquid toward a high-pressure rinsing spot which is defined on the surface-to-be-cleaned of the substrate.

Although high-pressure rinsing as well uses a slit as during ultrasonic rinsing, for valid rinsing at a relatively low jet liquid pressure and for maintaining ultrasonic oscillation of rinsing liquid to a maximum extent, jetting out of high-pressure liquid as a spot as in the structure of the third invention is preferable.

<Fourth Invention>

According to a structure of a fourth invention, the substrate cleaning apparatus of the third invention further comprises d) high-pressure rinsing nozzle swinging means for swinging the high-pressure rinsing nozzle along a locus which passes above the center of rotation of the substrate and which is substantially parallel to a surface of the substrate.

When the high-pressure rinsing nozzle swings in this manner, a bubbling-induced cavitation effect is created inside the rinsing liquid which is supplied onto a surface of the substrate. This further enhances the cleaning ability.

<Fifth Invention>

According to a structure of a fifth invention, in the substrate cleaning apparatus of the fourth invention, the high-pressure rinsing spot is set at such a position in the vicinity of the ultrasonic rinsing line so as to scan the substrate before the ultrasonic rinsing line scans the substrate as the substrate is rotated.

An advantage according to the structure of the fifth invention will be described in detail later, in relation to preferred embodiments.

<Sixth Invention>

According to a structure of a sixth invention, in the substrate cleaning apparatus of the fifth invention, the high-pressure rinsing spot is set shifted toward a farther one of the both end points of the ultrasonic rinsing line which is farther from the center of rotation of the substrate.

An advantage according to the structure of the sixth invention as well will be described in detail later, in relation to preferred embodiments.

<Seventh To Twelfth Inventions>

These inventions are method inventions which respectively correspond to the first to the sixth apparatus inventions. As structures and functions of these inventions are understandable from the description above on the apparatus inventions and a description in the following on preferred embodiments, a redundant description will be simply omitted.

<Thirteenth Invention>

According to a structure of a thirteenth invention, the substrate cleaning apparatus of the first invention further comprises c) moving means for moving said substrate or both the ultrasonic cleaning means and the high-pressure cleaning means relative to each other, and is characterized in that rinse-scanning is performed on the substrate while performing the translating.

<Fourteenth Invention>

According to a structure of a fourteenth invention, in the substrate cleaning apparatus of the thirteenth invention, the ultrasonic cleaning means includes a-1) an ultrasonic rinsing nozzle for injecting the liquid which is subjected to the ultrasonic wave, through a slit, toward an ultrasonic rinsing line which is defined on a surface-to-be-cleaned of the substrate, and the high-pressure cleaning means includes b-1) a high-pressure rinsing nozzle for jetting out high-pressure liquid toward an arrangement of high-pressure rinsing spots which is defined on the surface-to-be-cleaned of the substrate.

That is, in this apparatus, ultrasonic rinsing is realized in the form of a line and high-pressure rinsing is realized in the form of arranged points on the surface-to-be-cleaned of the substrate.

<Fifteenth Invention>

According to a structure of a fifteenth invention, the substrate cleaning apparatus of the fourteenth invention further comprises d) high-pressure rinsing nozzle swinging means for swinging the high-pressure rinsing nozzle along the direction of the arrangement of the high-pressure rinsing spots.

<Sixteenth Invention>

According to a structure of a sixteenth invention, in the substrate cleaning apparatus of the fifteenth invention, there are a plurality of the high-pressure rinsing nozzles which are disposed on the both sides of the ultrasonic rinsing nozzle, so that there are a plurality of the arrangements of the high-pressure rinsing spots which are defined on the both sides of the ultrasonic rinsing line.

Of various preferred embodiments described later, a substrate cleaning apparatus 100 as that shown in FIG. 13 is a typical example of an application of the sixteenth and the seventeenth inventions.

<Seventeenth Invention>

According to a structure of a seventeenth invention, in the substrate cleaning apparatus of the sixteenth invention, the ultrasonic rinsing nozzle injects the liquid approximately perpendicularly to the surface-to-be-cleaned of the substrate, and the high-pressure rinsing nozzles each jet out the high-pressure liquid at an angle which is approximately the same or away from the direction in which the liquid is injected from the ultrasonic rinsing nozzle.

<Eighteenth Invention>

According to a structure of an eighteenth invention, in the substrate cleaning apparatus of the fifteenth invention, the substrate is transported relative to the ultrasonic cleaning means and the high-pressure cleaning means in one predetermined direction, and the arrangement of the high-pressure rinsing spots are set at such positions so as to scan the substrate in the one predetermined direction before the ultrasonic rinsing line scans the substrate.

Of various preferred embodiments described later, a substrate cleaning apparatus 200 as that shown in FIGS. 2A and 2B is a typical example of an application of the eighteenth and the nineteenth inventions.

<Nineteenth Invention>

According to a structure of a nineteenth invention, in the substrate cleaning apparatus of the eighteenth invention, the ultrasonic rinsing nozzle injects the liquid at an angle which is inclined toward the predetermined direction with respect to the surface-to-be-cleaned of the substrate, and of the both sides of the ultrasonic rinsing nozzle, the high-pressure rinsing nozzles are disposed only on one side which corresponds to an opposite direction to the predetermined direction in which the substrate is transported, and the high-pressure rinsing nozzles each jet out the high-pressure liquid at an angle which is approximately the same or more inclined than the direction in which the liquid is injected from the ultrasonic rinsing nozzle.

<Twentieth To Twenty-Second Inventions>

These inventions are method inventions which respectively correspond to the thirteenth to the fifteenth apparatus inventions. As structures and functions of these inventions are understandable from the description above on the apparatus inventions and a description in the following on preferred embodiments, a redundant description will be simply omitted.

As described above, according to the first to the twenty-second inventions, as combined rinsing combining ultrasonic rinsing and high-pressure rinsing is performed, synergy of a foreign matter removing ability and a foreign matter discharging ability, i.e., advantages of the respective rinsing methods enhances the rinsing ability of rinsing a substrate.

Particularly because a foreign matter which is removed by the high-pressure rinsing is swiftly discharged by an affluent quantity of the ultrasonic rinsing liquid, the cleaning ability is further better than where the rinsing methods are performed separately by separate apparatuses.

Further, since combined rinsing according to the present invention is combination of non-contact type rinsing methods, the synergy of the rinsing methods realizes a sufficient rinsing ability, it is not necessary to excessively increase the pressure for high-pressure rinsing. Hence, there is no damage such as a flow to a substrate and no uneven rinsing.

When high-pressure rinsing is performed while swinging as in the fourth, the tenth, the fifteenth and the twenty-second inventions in particular, a bubbling-induced cavitation effect is created inside the rinsing liquid which is supplied onto a surface of the substrate. This further enhances the rinsing ability.

Further, when the high-pressure rinsing spot is defined in front of the ultrasonic rinsing line as the substrate is rinsed while rotated as in the fifth and the eleventh inventions, it is possible to appropriately set the quantity of the ultrasonic rinsing liquid at a high-pressure rinsing position, and therefore, high-pressure rinsing is performed efficiently through a layer of the ultrasonic rinsing liquid.

In addition, when the high-pressure rinsing spot is set shifted toward a farther one of the both end points of the high-pressure rinsing line which is farther from the center of rotation of the substrate as in the sixth and the twelfth inventions, it is possible to rinse without wasting the rinsing liquid.

Still further, when the high-pressure rinsing nozzle jets out the high-pressure liquid at an angle which is approximately the same or more inclined than the direction for injecting the ultrasonic rinsing liquid as in the seventeenth and the nineteenth inventions, it is possible to prevent a foreign matter which is removed by the high-pressure rinsing from returning toward the ultrasonic rinsing nozzle. Hence, both the foreign matter removing ability and the foreign matter discharging ability are realized more efficiently.

Accordingly, an object of the present invention is to provide for a substrate rinsing technique which exhibits an excellent rinsing ability without damaging a substrate and while maintaining time-effective rinsing.

The present invention particularly aims at enabling both an ability of removing a foreign matter which is adhered to a surface-to-be-cleaned of a substrate and an ability of discharging a removed foreign matter outside a substrate.

As herein termed, "a foreign matter" generally refers to an object which is to be removed by cleaning, including residual processing liquid which is applied prior to cleaning and particles.

These and other objects, features, aspects and advantages of the present invention will become more apparent from the following detailed description of the present invention when taken in conjunction with the accompanying drawings.

DESCRIPTION OF THE PREFERRED EMBODIMENTS

1. Principles For Solving Problems

Figure 1:
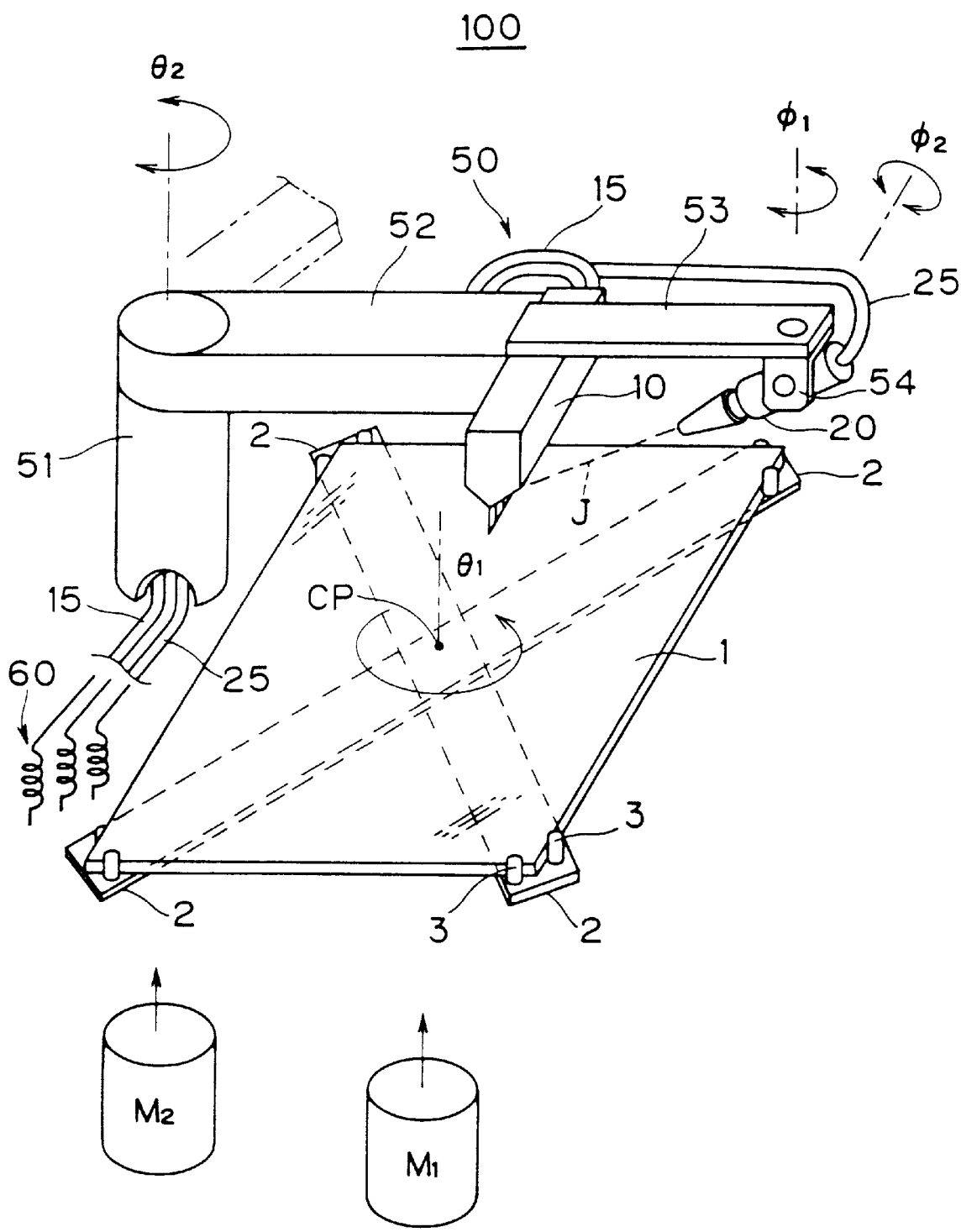
FIG. 1 is an essential perspective view of a substrate rinsing apparatus according to a first preferred embodiment of the present invention.

To achieve the objects described earlier, the present invention requires combined rinsing which includes ultrasonic rinsing method and a high-pressure rinsing method. Before describing the combined rinsing, advantages and disadvantages of the two rinsing methods will be described.

<1-1. Advantage And Disadvantage Of Ultrasonic Rinsing>

First, since ultrasonic rinsing methods perform rinsing while supplying a relatively large quantity of liquid, the ultrasonic rinsing methods have an excellent function (i.e., liquid replaceability) of quickly supplying new rinsing liquid onto a substrate and externally discharging foreign matter from a surface of the substrate together with the rinsing liquid. However, as ultrasonic rinsing does not have a very strong function of removing foreign matter, ultrasonic rinsing alone cannot easily remove foreign matter which adheres to the surface of the substrate.

<1-2. Advantage and Disadvantage Of High-Pressure Rinsing>

On the other hand, the high-pressure rinsing method is a method which removes foreign matter by means of the dynamic effect of a high-pressure rinsing jet, and therefore, is excellent in removing foreign matter. However, since a relatively small quantity of liquid is ejected according to this type of method, high-pressure rinsing alone is poor in terms of liquid replaceability. Thus, this type of method still has a problem that a foreign matter will adhere again to the surface of the substrate.

Although the problem of foreign matter again adhering to the surface is solved to a certain extent if the emission pressure of a high-pressure rinsing jet is increased, an increased emission pressure tends to damage a substrate surface, leading to new problems such as a flaw to a circuit pattern which is formed on the surface of the substrate, and uneven rinsing.

<1-3. Advantage Of Combined Rinsing Which Combines Ultrasonic Rinsing And High-Pressure Rinsing>

For the reason described above, the present invention proposes a structure for performing combined rinsing which combines an ultrasonic rinsing method and a high-pressure rinsing method. In the proposed structure, the flow of a relatively large quantity of liquid which is supplied for ultrasonic rinsing discharges not only foreign matter which is removed by ultrasonic rinsing but also foreign matter which is removed by high-pressure rinsing. Hence, it is possible to prevent re-adhering of removed foreign matter to a surface of a substrate while utilizing a powerful rinsing ability of high-pressure rinsing. This is a newly-created unique function which is obtained by combining high-pressure rinsing and ultrasonic rinsing.

Further, the combination of high-pressure rinsing and ultrasonic rinsing enhances an overall ability for removing foreign matters. As this eliminates the need to very much increase the pressure of a high-pressure rinsing jet during high-pressure rinsing, damage by a high-pressure rinsing jet to a substrate and uneven rinsing are prevented.

In short, according to the present invention, synergy of a foreign matter removing ability of high-pressure rinsing and a foreign matter discharging ability of ultrasonic rinsing creates an effect which is better than the sum of these two functions.

2. First Preferred Embodiment

<2-1. Brief Description Of Overall Mechanism And Operation>

FIG. 1 is an essential perspective view of a substrate cleaning apparatus 100 which represents a first preferred embodiment which is common to the first to the twelfth inventions. The substrate cleaning apparatus 100 is structured to perform ultrasonic rinsing and high-pressure rinsing at the same time, i.e., combined rinsing, to a surface of a glass substrate 1 for a liquid crystal display apparatus. The substrate cleaning apparatus 100 is classified as a so-called spin scrubber.

In FIG. 1, a chuck for holding the substrate 1 includes a cross-shaped arm 2. The substrate 1 is received at four corners by a plurality of pins 3 which are disposed to tips of the arm 2, and the substrate 1 is rotated in a horizontal plane in a direction $\theta_1$ in FIG. 1. A drive source for such rotation is a motor $M_1$. For convenience of illustration, FIG. 1 does not show how the motor $M_1$ is linked to the chuck.

To clean the substrate 1, a combined cleaning mechanism 50 is disposed for performing high-pressure rinsing and ultrasonic rinsing. Within the combined cleaning mechanism 50, an arm 52 is linked to a column 51 so that the column 51 and the arm 52 are revolvable when driven by a motor $M_2$ in a direction $\theta_2$ (FIG. 1 does not show how the motor $M_2$ is linked to the column 51 and the arm 52.). An ultrasonic rinsing nozzle 10 is fixed to a tip of the arm 52. The ultrasonic rinsing nozzle 10 has the subsequently discovered internal structure, so that an ultrasonic wave forces emitted rinsing liquid in the form of a curtain from a slit onto a surface of the substrate 1.

Figure 2A:
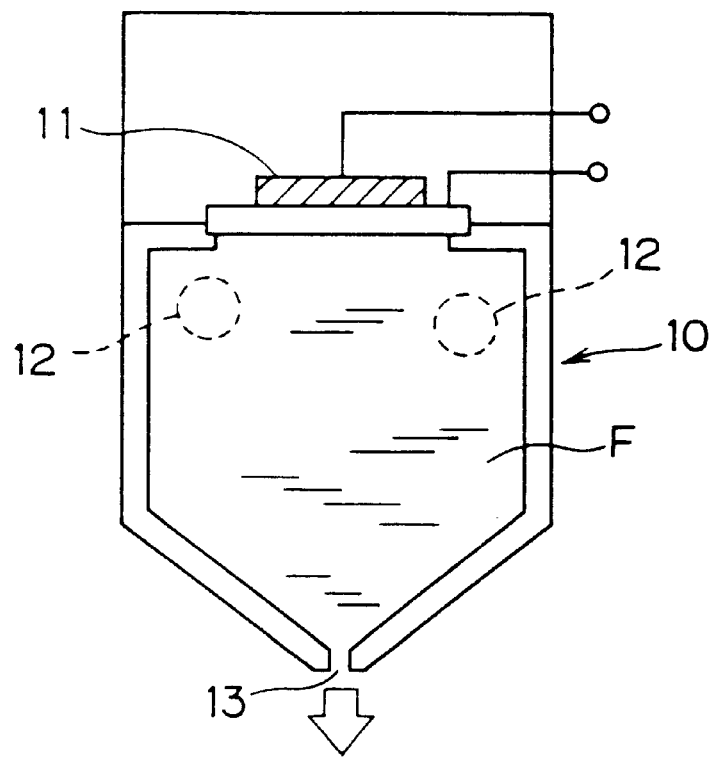
FIGS. 2A and 2B are views showing the details of an ultrasonic rinsing nozzle.
Figure 2B:
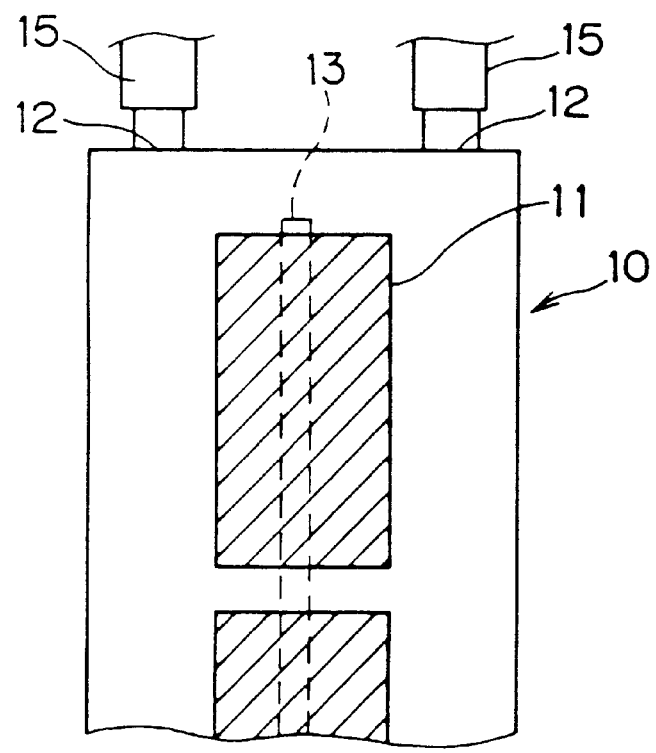

FIG. 2A is a conceptual front view of the ultrasonic rinsing nozzle 10 in perspective, while FIG. 2B is a conceptual (partial) plan view of the ultrasonic rinsing nozzle 10 in perspective. In the ultrasonic rinsing nozzle 10, an ultrasonic wave is emitted from an ultrasonic wave oscillator 11 onto rinsing liquid F which is ejected through a rinsing liquid inlet 12 and the rinsing liquid F is jetted out through a slit 13 which is disposed beneath. The length of the slit 13 is 80 mm and the width thereof is 2 mm, for instance.

A high frequency oscillating voltage is supplied to the ultrasonic wave oscillator 11. Preferably, the frequency of the supplied voltage is in the range of:

0.8 MHz–2.0 MHz

More preferably, the range is:

1.2 MHz–1.8 MHz

The rinsing liquid inlet 12 is linked to a resin tube 15. The tube 15 is passed through the arm 52 (See FIG. 1) and the column 51 and linked to a rinsing liquid supply part through a spiral tube 60.

The quantity of the rinsing liquid F to be supplied is preferably in the range of:

7–10 liters/min

A linkage arm 53 extends from the ultrasonic rinsing nozzle 10 of FIG. 1, and a high-pressure rinsing nozzle 20 is attached to a tip of the linkage arm 53 through a connecting member 54. A small hole (having a diameter of 0.2 mm, for instance) of a circular shape in cross section is formed in a tip of the high-pressure rinsing nozzle 20, so that a high-pressure rinsing jet J, which is supplied through a resin tube 25, is ejected almost as a beam. The tube 25 is passed through the arm 52 and the column 51, and is linked to the rinsing liquid supply part through the spiral tube 60.

The pressure of the high-pressure rinsing liquid which is supplied to the high-pressure rinsing nozzle 20 is preferably in the range of:

5 kg/cm$^2$–15 kg/cm$^2$

Further preferably, the pressure is in the range of:

8 kg/cm$^2$–10 kg/cm$^2$

An example of a desired quantity of the high-pressure rinsing liquid to be supplied is:

0.05 liters/min

The connecting member 54 is revolvable in a direction $\phi_1$ with respect to the linkage arm 53, while the high-pressure rinsing nozzle 20 is revolvable in a direction $\phi_2$ with respect to the connecting member 54. Hence, the direction of the high-pressure rinsing nozzle 20 is optionally adjustable by manual adjustment. Manual adjustment is executed in a preparatory stage prior to actual rinsing. During rinsing with the combined cleaning mechanism 50, the high-pressure rinsing nozzle 20 is fixed in an adjusted direction.

Now, brief description will be given on a mechanical operation of the apparatus 100. Details of positional relationship between ultrasonic rinsing and high-pressure rinsing and effects of ultrasonic rinsing and high-pressure rinsing will be subsequently described.

Before the substrate 1 is set in the substrate cleaning apparatus 100, the arm 52 and the members fixed thereto are retracted in the direction of an imaginary line in FIG. 1. Upon mounting of the substrate 1 by a transport robot onto the cross-shaped arm 2 of the chuck, the arm 52 and the members fixed thereto, revolved in the $\theta_2$ direction, are moved to the solid-line positions in FIG. 1. As the substrate 1 starts to rotate at a high speed, the ultrasonic rinsing nozzle 10 ejects the ultrasonic rinsing liquid and the high-pressure rinsing nozzle 20 jets out the high-pressure rinsing jet J while the arm 52 reciprocally swings in the $\theta_2$ direction, which in turn swings the ultrasonic rinsing nozzle 10 and the high-pressure rinsing nozzle 20 back and forth along an arc locus within a horizontal plane above the substrate 1. In this manner, respective portions in the top surface of the substrate 1 are scanned by combined rinsing combining ultrasonic rinsing and high-pressure rinsing.

Upon rinsing, the respective nozzles 10 and 20 are retracted together with the arm 52. Spinning of the substrate 1 is stopped after residual rinsing liquid remaining on the substrate 1 is drained by rotation (i.e., by spin dry). In a reversed process to that for setting in the substrate, the substrate 1 is unloaded.

Although not shown in FIG. 1, rinsing liquid which is drained off from the substrate 1 is collected by a cup and discharged.

<2-2. Positional Relationship Between Ultrasonic Rinsing And High-Pressure Rinsing>

Figure 3:
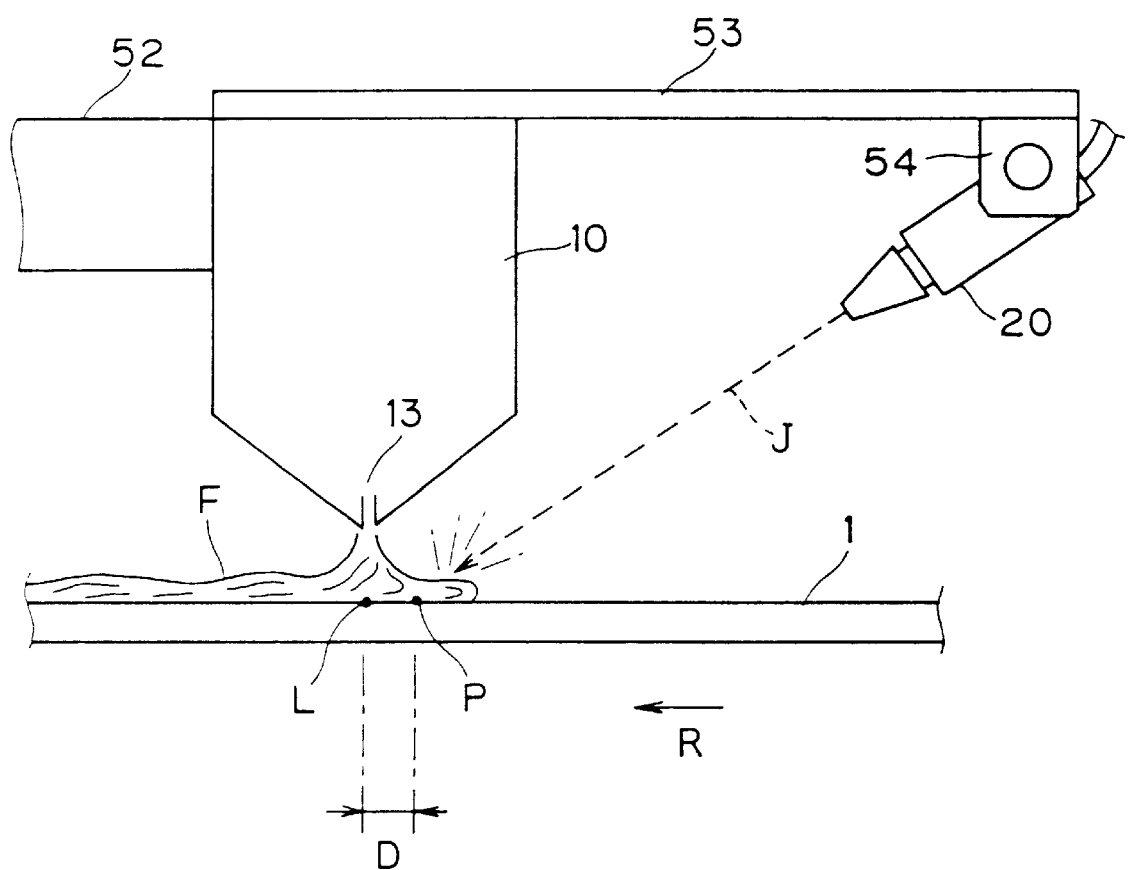
FIG. 3 is an enlarged view showing a positional relationship between nozzles as it is viewed from a direction which is perpendicular to an elongated direction of the ultrasonic rinsing nozzle.
Figure 4:
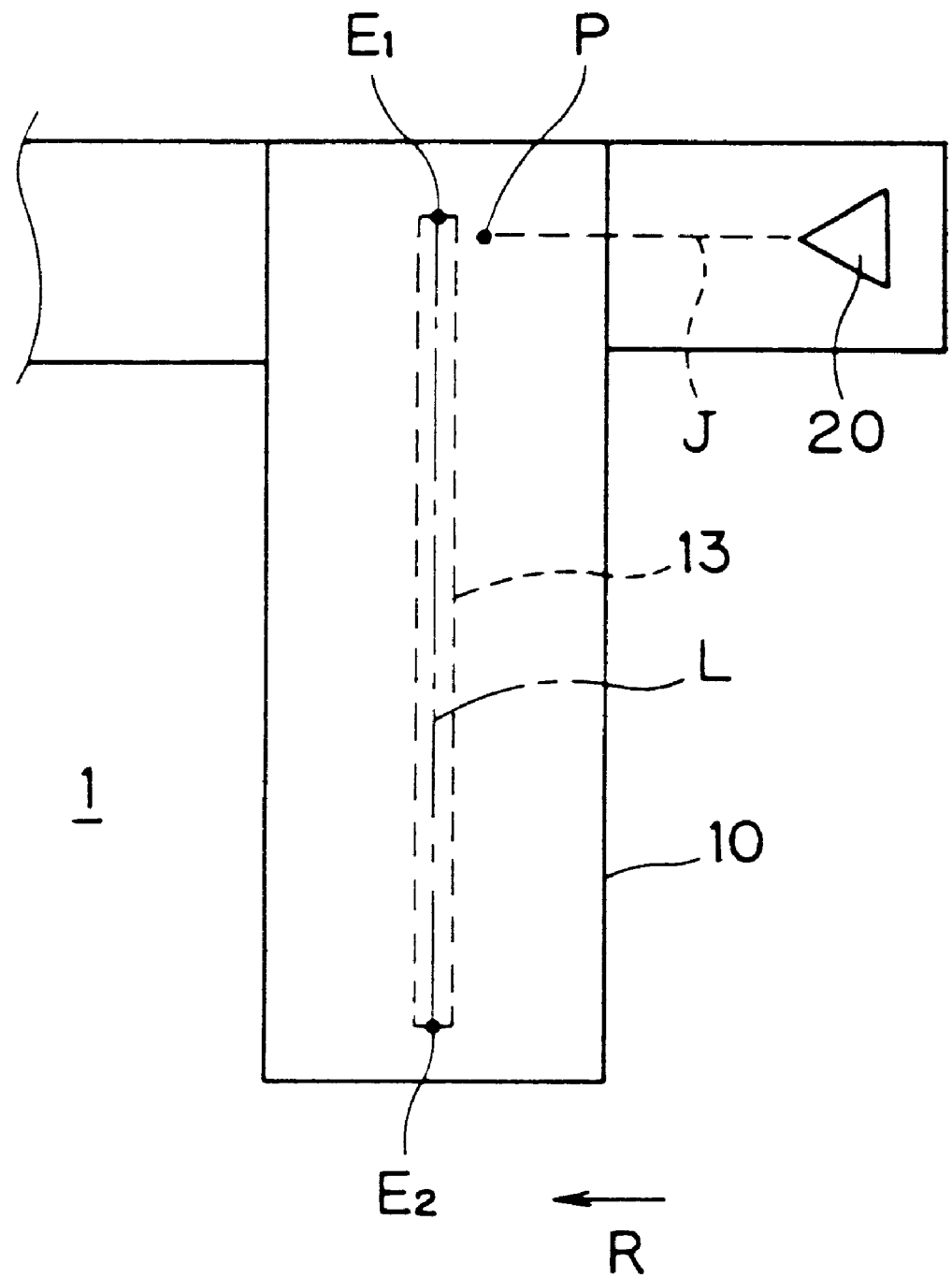
FIG. 4 is a view showing the positional relationship between the nozzles as it is viewed in perspective from above.

FIG. 3 is an enlarged view of the ultrasonic rinsing nozzle 10 as it is viewed from a direction which is perpendicular to an elongated direction of the ultrasonic rinsing nozzle 10, and FIG. 4 is a view showing a positional relationship as it is viewed in perspective from above.

Referring to FIG. 4 the ultrasonic rinsing liquid from the ultrasonic rinsing nozzle 10 is ejected approximately perpendicularly as a curtain onto the top surface of the substrate 1. The position at which the rinsing liquid in the form of a curtain hits the surface of the substrate 1 defines an imaginary line (i.e., ultrasonic rinsing line) L. While the substrate 1 rotates in the $\theta_1$ direction in FIG. 1, although the substrate 1 moves relatively in a direction R in FIG. 4 immediately below the nozzles 10 and 20, the ultrasonic rinsing line L extends in a direction which crosses the rotation direction R of the substrate 1.

Further, as shown in FIG. 3, the rinsing liquid F ejected through the slit 13 of the ultrasonic rinsing nozzle 10, after widened to a certain extent, is carried by the rotation of the substrate mainly toward a downstream side (which is the left-hand side in FIG. 3).

On the other hand, as shown in FIGS. 3 and 4, an imaginary high-pressure rinsing spot P, which is an ejection target point for jetting out the high-pressure rinsing jet J, is set at such a position in the vicinity of the ultrasonic rinsing line L so as to scan the substrate 1 before the ultrasonic rinsing line L scans the substrate 1 as rotation R ($\theta_1$ in FIG. 1) of the substrate 1 progresses. A distance D (See FIG. 3) between the imaginary high-pressure rinsing spot P and the ultrasonic rinsing line L is 3–10 mm, for instance, so that the high-pressure rinsing spot P is set within an area in which the rinsing liquid F ejected through the slit 13 of the ultrasonic rinsing nozzle 10 exists. Such adjustment of the direction is realized by adjusting the angle of the high-pressure rinsing nozzle 20 through the connecting member 54.

Figure 5:
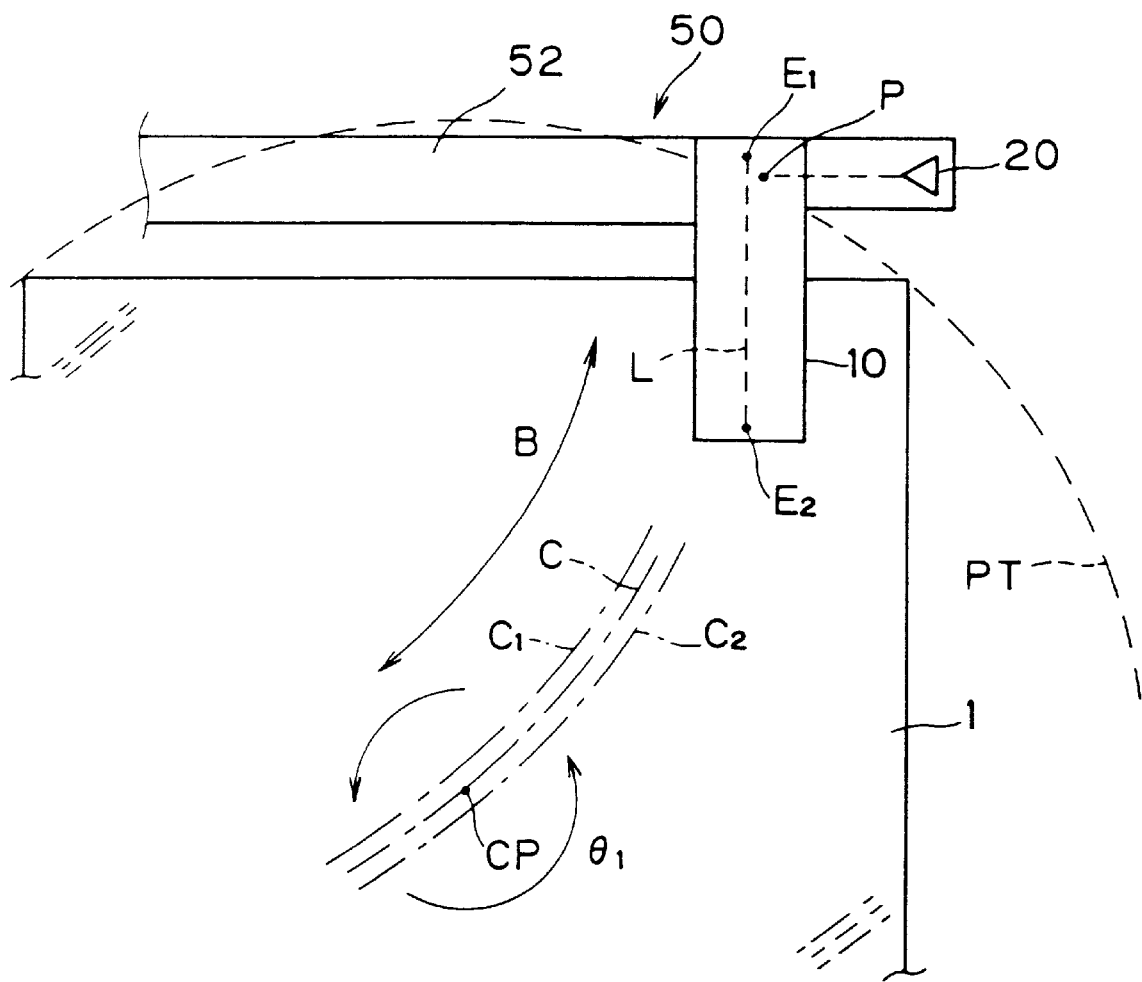
FIGS. 5 to 7 are explanatory views of oscillating scanning according to the first preferred embodiment.

Further, between both end points $E_1$ and $E_2$ of the ultrasonic rinsing line L, the high-pressure rinsing spot P is set shifted toward the end point $E_1$. As shown in FIG. 5 which conceptually illustrates oscillation of the combined rinsing mechanism 50, end point $E_1$ is a farther one of the both end points $E_1$ and $E_2$ of the ultrasonic rinsing line L from the center of rotation CP of the substrate 1. More specifically, the first preferred embodiment requires that the high-pressure rinsing spot P is set shifted toward the end point $E_1$. The reason for this will be described in detail later.

<2-3. Basic Effect Of Combined Rinsing>

A basic effect of combined rinsing of combining the ultrasonic rinsing and high-pressure rinsing according to the first preferred embodiment is as described below. (A description will be given later on swinging scanning.)

As shown in FIG. 3, an optional portion on the substrate 1 moves in the direction R as the substrate rotates, reaching somewhere below and near the ultrasonic rinsing nozzle 10. This subjects the optional portion to rinsing by the high-pressure rinsing jet J, first. Meanwhile, at the destination of the high-pressure rinsing jet J, there is the ultrasonic rinsing liquid F which is supplied from the ultrasonic rinsing nozzle 10. Hence, foreign matter which is removed by the high-pressure rinsing jet J is carried away by the flow of the ultrasonic rinsing liquid F toward a downstream side (which is the left-hand side in FIG. 3) and is then washed away outside from the surface of the substrate 1.

The portion which is processed by such high-pressure rinsing, as the substrate 1 rotates, next moves to immediately below the slit 13 of the ultrasonic rinsing nozzle 10, so as to be subjected to ultrasonic rinsing at that point to thereby remove a foreign matter which was not removed by high-pressure rinsing. A foreign matter which is removed by ultrasonic rinsing as well is carried away by the flow of the ultrasonic rinsing liquid toward the downstream side and washed away outside from the surface of the substrate 1.

In this manner, not only the substrate 1 is subjected to the respective rinsing effects of high-pressure rinsing and ultrasonic rinsing, but also a foreign matter which is removed by high-pressure rinsing is ejected outside the substrate 1 together with a foreign matter which is removed by ultrasonic rinsing, thereby preventing removed foreign matters from adhering to the substrate 1 once again. As a result, the rinsing effect is larger than a sum of the rinsing abilities of the two types of rinsing.

By the way, the high-pressure rinsing spot P is not set on the ultrasonic rinsing line L but is set toward an upstream side (which is the right-hand side in FIG. 3) with the distance D in the first preferred embodiment. This is because the efficiency of high-pressure rinsing is improved as the quantity of flow of the ultrasonic rinsing liquid is appropriate on the upstream side to the ultrasonic rinsing line L and as the high-pressure rinsing jet J reaches the surface of the substrate 1 without fail through the layer of the ultrasonic rinsing liquid F.

Further, according to the first preferred embodiment, the ultrasonic rinsing nozzle 10 injects the ultrasonic rinsing liquid F approximately perpendicularly to the surface of the substrate 1 (i.e., a surface-to-be-cleaned). This is related to a fact that spin-type cleaning of a substrate generally requires to rotate a substrate at high rotation speed and to swing a rinsing mechanism. That is, in general, if ultrasonic rinsing liquid is injected approximately perpendicularly to a surface-to-be-cleaned, splash of the ultrasonic rinsing liquid at the surface-to-be-cleaned jumps back into an ultrasonic rinsing nozzle and damages an ultrasonic oscillator of the nozzle. To deal with this, an ultrasonic rinsing nozzle is used at an angle with respect to a surface-to-be-cleaned in many cases. However, in the case of the substrate used in the first preferred embodiment which is rotated at a high speed, splash of the ultrasonic rinsing liquid at the surface-to-be-cleaned is blown off to the downstream side, reducing a chance for the splash to jump back into the ultrasonic rinsing nozzle. Moreover, according to the first preferred embodiment, swing of the rinsing mechanism changes the direction in which splash of the ultrasonic rinsing liquid is bounced off. To ensure the maximum ability of ultrasonic rinsing, the first preferred embodiment requires that the ultrasonic rinsing nozzle 10 injects the ultrasonic rinsing liquid F approximately perpendicularly to the surface of the substrate 1. In the first preferred embodiment, the rotation speed for rotating the substrate 1 is 500 rpm and the swing speed for swinging the rinsing mechanism is 200 mm/sec in the vicinity of the nozzles, for example.

Meanwhile, the high-pressure rinsing nozzle 20 injects a high-pressure rinsing jet in an angled direction toward the downstream side of the ultrasonic rinsing liquid as shown in FIG. 3, which creates an advantage that a foreign matter which is removed by high-pressure rinsing is easily carried toward the downstream side.

Further, since the apparatus according to the first preferred embodiment performs combined rinsing combining ultrasonic rinsing and high-pressure rinsing parallel in time within one apparatus, a cleaning time is short. Since this combined rinsing is combination of non-contact type rinsing methods, there is no damage to the substrate 1.

Still further, since sufficient rinsing is realized by combination ultrasonic rinsing and high-pressure rinsing, it is not necessary to increase the jet pressure of high-pressure rinsing very much, and therefore, the high-pressure rinsing jet J does not damage the substrate.

<2-4. Swinging Scanning>

Next, rinsing utilizing swinging scanning will be described with reference to FIG. 5. In the first preferred embodiment, high-pressure rinsing is performed spot to spot and the ultrasonic rinsing line L is set narrower than the diameter width of the substrate 1. Hence, to clean the entire surface of the substrate 1, the substrate 1 is rotated within the horizontal plane while swinging the nozzles 10 and 20 which perform rinsing along a horizontal locus on the substrate 1. This swinging B, which is shown at the symbol B in FIG. 5, is carried out between a locus PT of the four corners of the substrate 1 resulting from rotation of the substrate 1 and the center of rotation CP. While FIG. 5 shows portions of three swing loci C, $C_1$ and $C_2$, the swing locus C in center is a locus which is traced by the swinging high-pressure rinsing spot P. The other swing loci $C_1$ and $C_2$ are loci which are traced by the both end points $E_1$ and $E_2$, respectively, of the ultrasonic rinsing line L. Since a distance between the high-pressure rinsing spot P and the center of revolution of the arm 52 (i.e., the column 51 in FIG. 1) is different from a distance between the both end points $E_1$ and $E_2$ of the ultrasonic rinsing line L and the center of revolution of the arm 52, the three oscillation loci C, $C_1$ and $C_2$ have different radii from each other. Moreover, in the first preferred embodiment, the oscillation locus C of the high-pressure rinsing spot P is set to pass immediately above the center of rotation CP of the substrate 1, so that all portions of the surface of the substrate 1 are cleaned by high-pressure rinsing.

On the other hand, although the both end points $E_1$ and $E_2$ of the ultrasonic rinsing line L do not pass immediately above the center of rotation CP, this does not create any problem. This is because ultrasonic rinsing is performed line by line. As ultrasonic rinsing is performed line by line, the substrate is scanned by the ultrasonic rinsing line L over a section between the two oscillation loci $C_1$ and $C_2$. As far as the center of rotation CP is between the two oscillation loci $C_1$ and $C_2$, it is guaranteed that the respective portions of the substrate 1 are subjected to ultrasonic rinsing.

<2-5. Relationship Between Swinging Scanning And Combined Rinsing>

As such positional relationships and swinging scanning are set and combined rinsing combining ultrasonic rinsing and high-pressure rinsing is performed on the substrate, scanning rinsing as described below is performed.

Figure 6:
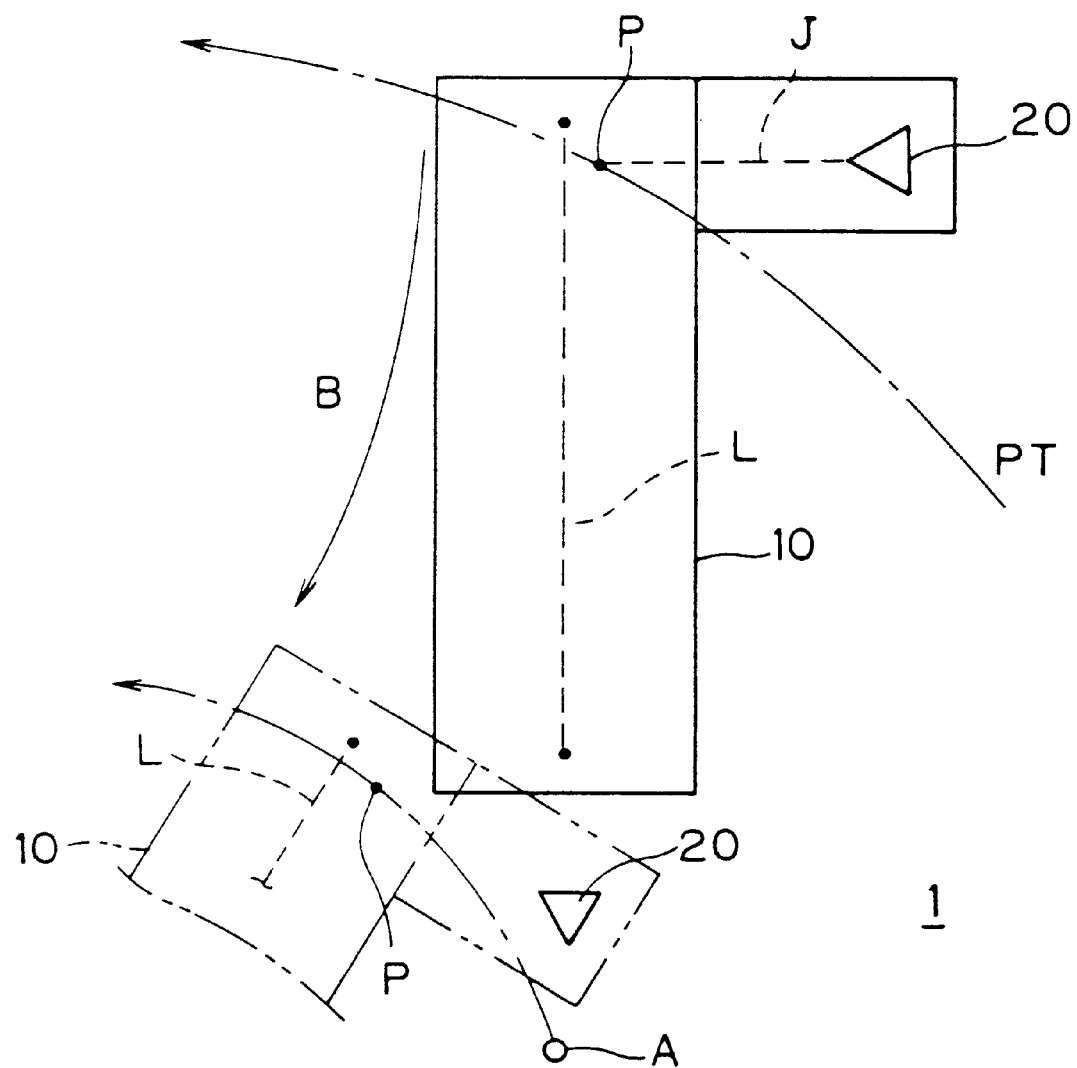

First, an optional position on the surface of the substrate 1 is designated at A, as shown in FIG. 6. The position A is not virtually subjected to the rinsing effect when the rinsing nozzles 10 and 20 are at the solid-line positions in FIG. 6.

As the rinsing nozzles 10 and 20 sway along an swing locus B, the position A crosses the ultrasonic rinsing line L while rotating in association with rotation of the substrate 1. Hence, the position A is subjected only to ultrasonic rinsing at this stage.

As the rinsing nozzles 10 and 20 further sway up to a position which is denoted by the imaginary line of FIG. 6, the position A on the substrate 1 passes across the high-pressure rinsing spot P and subsequently passes across the ultrasonic rinsing line L. At this stage, combined rinsing combining ultrasonic rinsing and high-pressure rinsing is performed on the position A.

As the rinsing nozzles 10 and 20 further sway, the position A moves off both the high-pressure rinsing spot P and the ultrasonic rinsing line L. Although the rinsing nozzles 10 and 20 may sway only once to only one side, the first preferred embodiment requires repeated reciprocal swaying, in which case combined rinsing and ultrasonic rinsing are carried out repeatedly as the rinsing nozzles sway back and subsequently keep swinging.

In this manner, the entire surface of the substrate 1 is subjected to combined rinsing. In the first preferred embodiment, when particularly noting the optional position A, there is a period in which the optional position A is rinsed only by ultrasonic rinsing but not by combined rinsing, this causes no problem. That is, since ultrasonic rinsing has an excellent liquid replaceability, even if there is a period in which ultrasonic rinsing alone is performed, there is no problem such as re-adhering of a removed foreign matter. Rather, when a foreign matter which can be removed only by ultrasonic rinsing is removed only by ultrasonic rinsing, it is possible to inject the high-pressure rinsing jet J only onto foreign matters which demand high-pressure rinsing, thereby further enhancing the rinsing effect.

Further, swinging scanning as described above moves the high-pressure rinsing jet J in injected ultrasonic rinsing liquid, which in turn creates a bubbling-induced cavitation effect inside the rinsing liquid which is supplied onto the surface of the substrate. This further enhances the rinsing effect.

<2-6. Advantage Of Setting High-Pressure Rinsing Spot Shifted>

Figure 7:
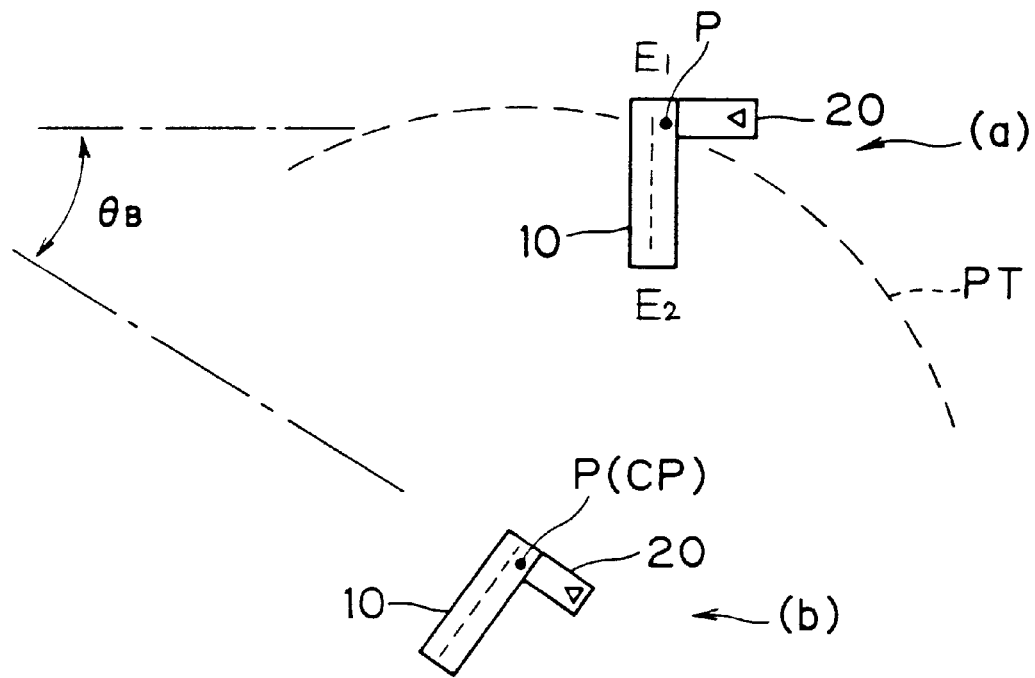
Figure 8:
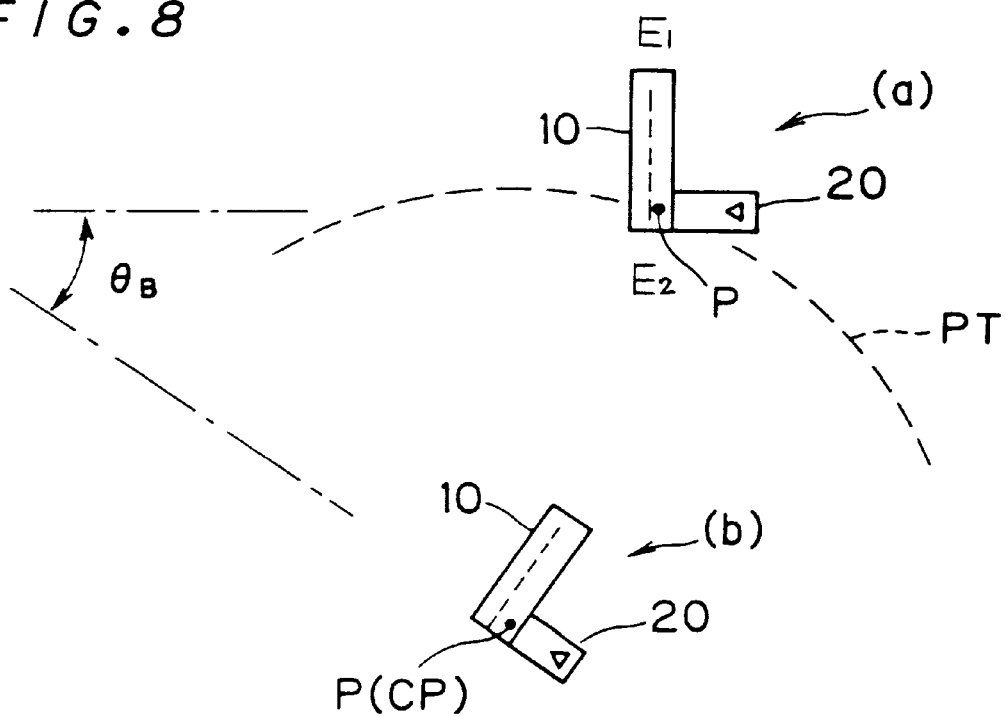
FIG. 8 is an explanatory view of oscillating scanning according to a compared example.

Next, with reference to FIG. 4, a description will be given on a reason for setting the high-pressure rinsing spot P shifted toward the farther one $E_1$ of the end points $E_1$ and $E_2$ of the ultrasonic rinsing line L from the center of rotation CP of the substrate 1. FIG. 7 is a conceptual view showing swinging scanning for the structure shown in FIG. 3, and FIG. 8 is a conceptual view showing swinging scanning for a case where conversely, the high-pressure rinsing spot P is set shifted toward the closer one $E_2$ of the end points $E_1$ and $E_2$ of the ultrasonic rinsing line L to the center of rotation CP of the substrate 1. In either case, the high-pressure rinsing spot P is swung the locus PT of the four corners of the substrate 1 resulting from rotation of the substrate 1 and a point near the center of rotation CP.

In the case shown in FIG. 7, in a condition (a) that the high-pressure rinsing spot P is over the locus PT, the ultrasonic rinsing nozzle 10 injects the ultrasonic rinsing liquid toward the surface of the substrate. In a condition (b) as well that the high-pressure rinsing spot P is over the center of rotation CP, the ultrasonic rinsing nozzle 10 injects the ultrasonic rinsing liquid toward the surface of the substrate. Hence, wasteful use of the ultrasonic rinsing liquid is avoided in the entire range of an swinging amplitude $\theta_B$.

On the other hand, in the case shown in FIG. 8, in the condition (a) that the high-pressure rinsing spot P is over the locus PT, most of the rinsing liquid from the ultrasonic rinsing nozzle 10 is injected only outside the locus PT. This is wasteful use of the ultrasonic rinsing liquid.

Thus, the arrangement according to the preferred embodiment shown in FIG. 3 has an advantage that the rinsing liquid is not wasted. Conversely describing, when the same quantity of the rinsing liquid is used, the rinsing effect is better.

<2-7. Example Of First Preferred Embodiment>

Table 1 shows a result confirming the cleaning effect of the apparatus according to the first preferred embodiment shown in FIG. 1. For comparison, Table 1 shows a case (1) that only high-pressure jet rinsing is performed and a case (2) that only ultrasonic rinsing is performed. Conditions for experiments are as follows:

Type Of Substrate 1 . . . a glass substrate for a liquid crystal display apparatus, with a chromium film formed at a surface;

Plan Area Size Of Substrate 1 . . . 360 mm×465 mm;

The Number Of Rotations Of Substrate 1 . . . 500 rpm;

Jet Outlet Hole Size Of High-Pressure Rinsing Nozzle 20 . . . 0.1 mm $\phi$;

Supplied Jet Pressure To High-Pressure Rinsing Nozzle 20 . . . 15 kgf/cm$^2$;

Ultrasonic Wave Power In Ultrasonic Rinsing Nozzle 10 . . . 110 W;

Rinsing Time . . . 10 sec; and

Measuring Method . . . counting the number of particles which are 1 μm or larger before and after rinsing that a resulting rinsing spot $P_B$ is in the vicinity of the center of the ultrasonic rinsing line L. In this case, although it is sufficient to set an swinging amplitude $\theta_{BC}$ within a range the rinsing spot $P_B$ reaches the center of rotation CP, if the swinging amplitude is further widened, it is possible to subject the entire portion of the substrate to high-pressure rinsing twice only by means of performing swinging once (i.e., swaying one way).

Figure 10:
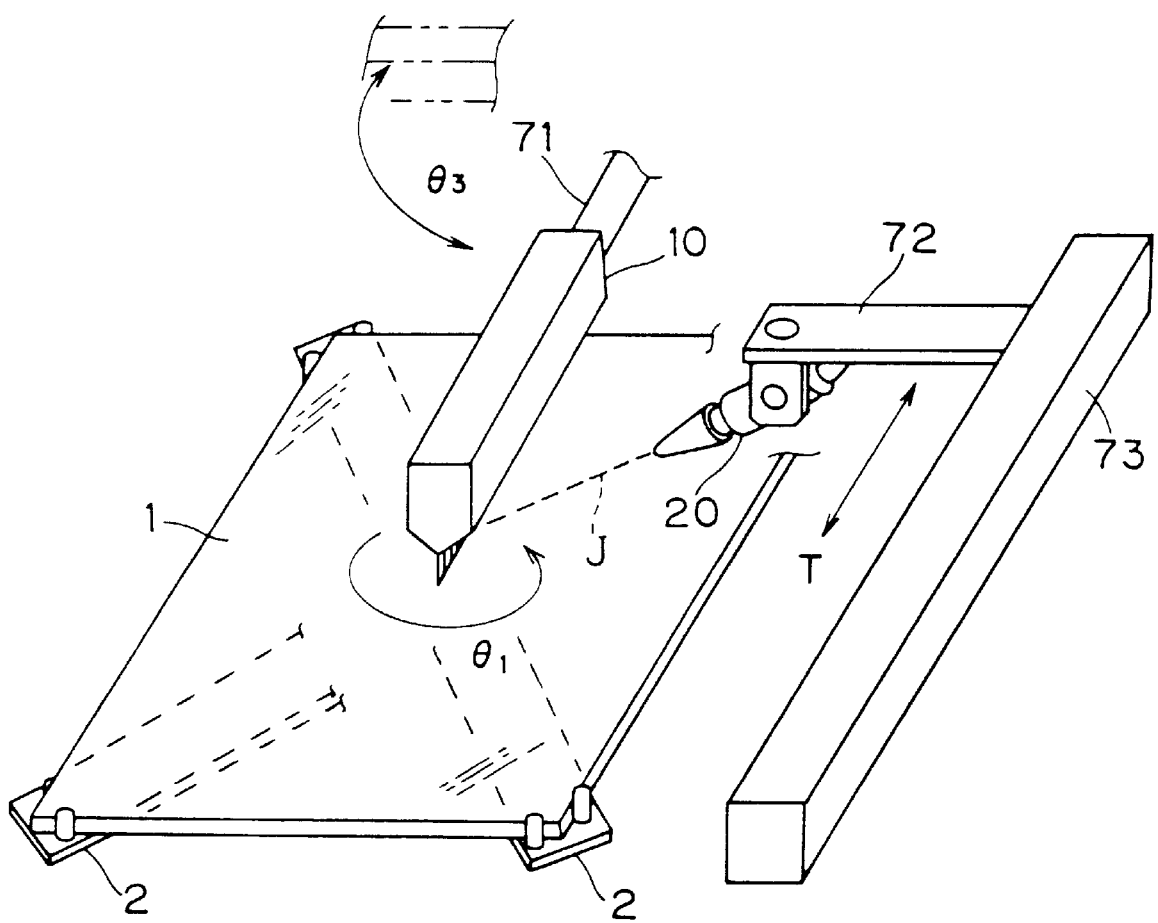
FIG. 10 is a view showing an example where an ultrasonic rinsing nozzle and a high-pressure rinsing nozzle are provided separately.

FIG. 10 shows an example of a structure in which the ultrasonic rinsing nozzle and the high-pressure rinsing nozzle are separated from each other. Of the nozzles, the length of the ultrasonic rinsing nozzle 10 is half the diagonal width of the substrate 1 or longer and the ultrasonic rinsing nozzle 10 does not swing while rinsing though nozzole 10 swings while rinsing in FIG. 5. An arm 71 which holds the ultrasonic rinsing nozzle 10 is retractable as shown by the imaginary line, so that the substrate 1 is inserted and discharged when the arm retracts. On the other hand, the high-pressure rinsing nozzle 20 is held by an arm 72 which can translate in a direction T when driven by a translation scanning mechanism 73. In this apparatus, the ultrasonic rinsing liquid is injected as a curtain while rotating the substrate 1, and rinse-scanning is performed on the substrate 1 as the high-pressure rinsing nozzle 20 linearly moves. While integrating the ultrasonic rinsing nozzle 10 and the high-pressure rinsing nozzle 20 as shown in FIG. 1 enhances

TABLE 1

| RINSING METHOD | THE NUMBER OF PARTICLES | | | THE NUMBER OF RESIDUAL ADHERING PARTICLES D | REMOVAL RATE OF RINSING E |
| --- | --- | --- | --- | --- | --- |
| | INITIAL SUBSTRATE A | PARTICLES AFTER ADHERED(*) B | AFTER RINSING C | | |
| ONLY HIGH-PRESSURE JET RINSING | 367 | 5829 | 450 | 83 | 98.5% |
| ONLY ULTRASONIC RINSING | 301 | 5653 | 329 | 28 | 99.5% |
| BOTH HIGH-PRESSURE JET RINSING AND ULTRASONIC RINSING (PREFERRED EMBODIMENTS OF PRESENT INVENTION) | 431 | 4218 | 442 | 11 | 99.7% |

D = C − A
E = [(B − D)/B] × 100 (%)
(*)The number of particles in a condition that particles are additionally adhered to an initial substrate.

As seen in Table 1, parallel use of a high-pressure jet and an ultrasonic wave according to the first preferred embodiment of the present invention enhances the effect of removing particles more than where only one of a high-pressure jet and an ultrasonic wave is used.

Although a difference is about 0.2–1.2% in the removal rate, in the case of a glass substrate for a liquid crystal display apparatus, only a slight difference in the number of residual particles largely influence the yield of producing substrates after cleaning. Hence, the first preferred embodiment of the present invention produces a better result than when only one rinsing method is used.

<2-8. Modified Example Of First Preferred Embodiment>

The present invention is not limited to the first preferred embodiment described above, but the following various modified examples are possible.

Figure 9:
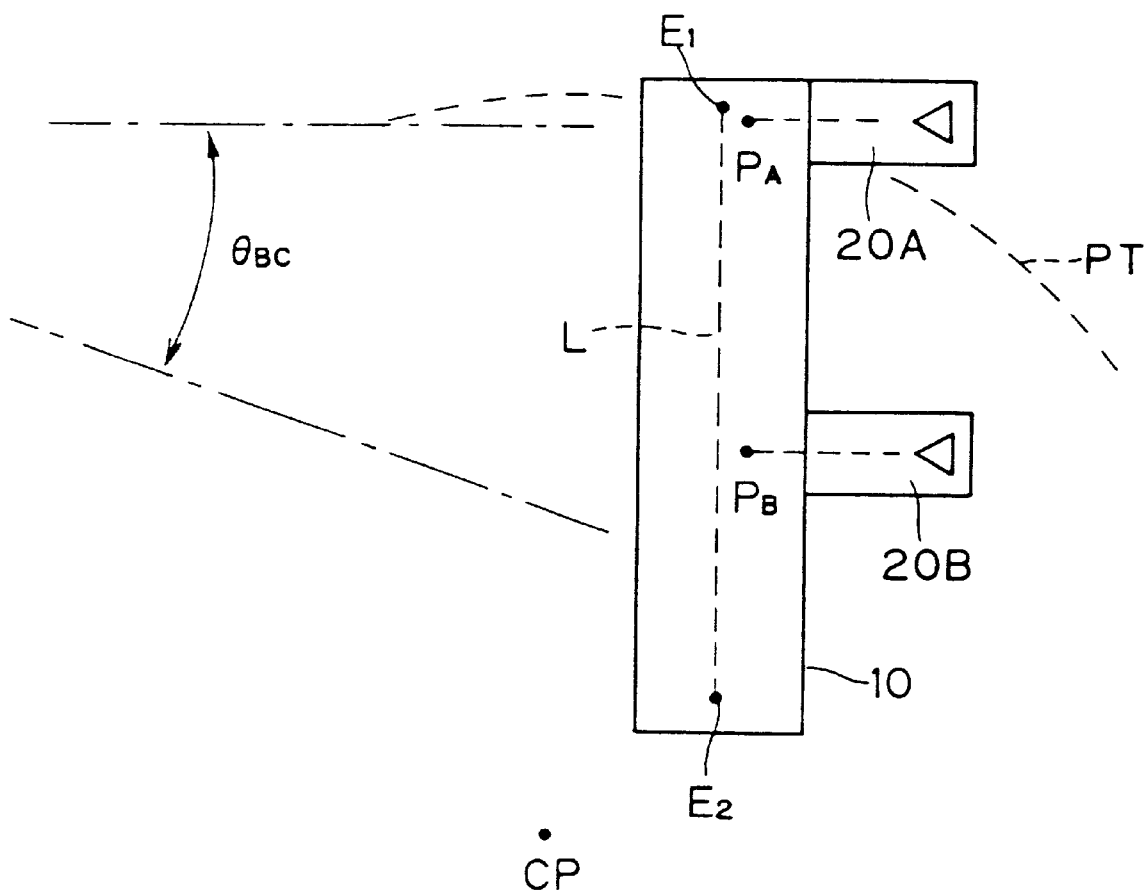
FIG. 9 is a view showing an example where a plurality of high-pressure rinsing nozzles are provided.

FIG. 9 represents a modified example where two high-pressure rinsing nozzles 20A and 20B are both used. In this case, one nozzle 20A of the two high-pressure rinsing nozzles is set so that a resulting rinsing spot $P_A$ is in the vicinity of the end point $E_1$ of the ultrasonic rinsing line L, while the other high-pressure rinsing nozzle 20B is set so the economic use, the present invention is applicable to a structure where these nozzles are separated from each other as shown in FIG. 10.

Figure 11:
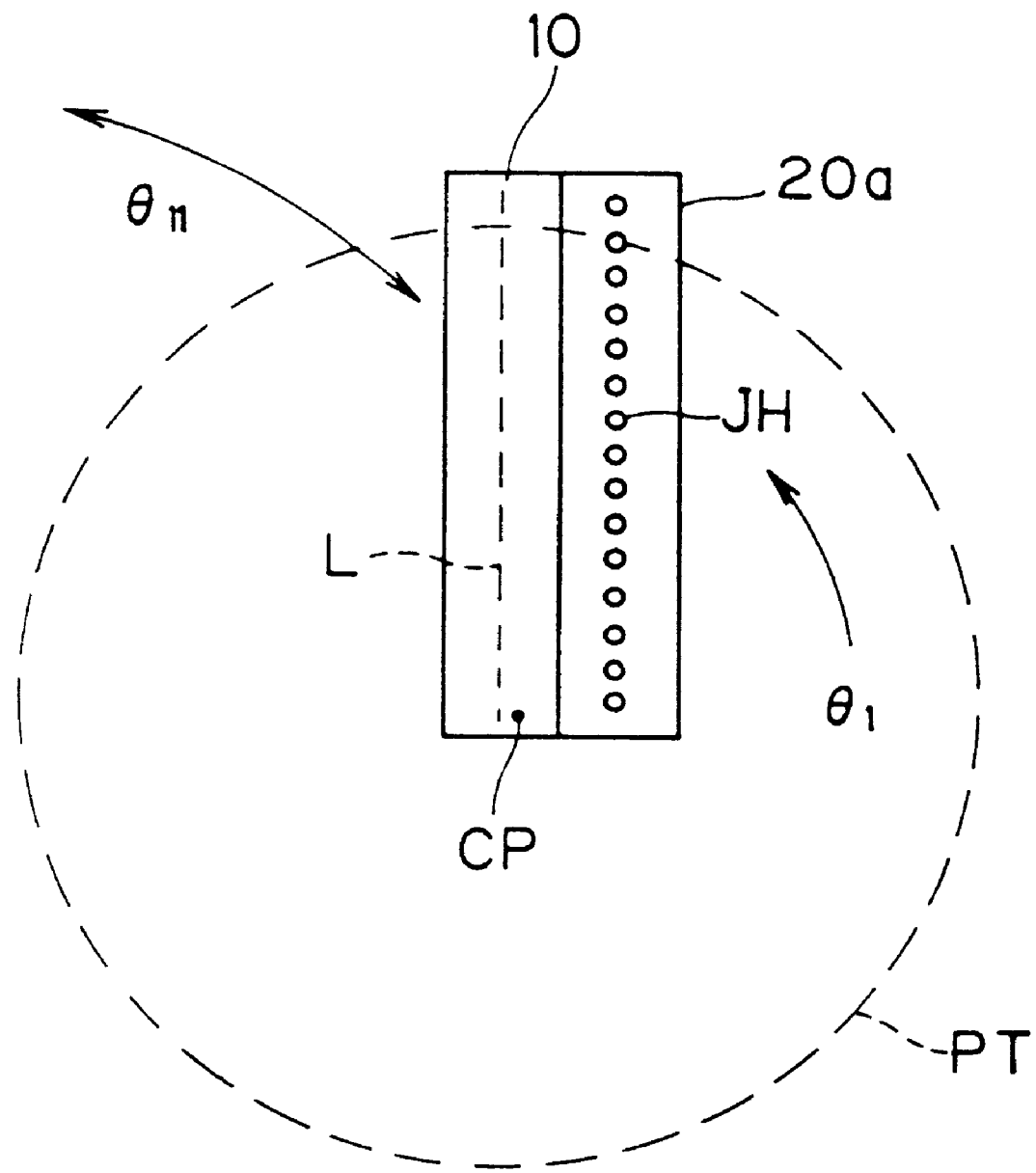
FIG. 11 is a view showing an example where a high-pressure rinsing nozzle having a number of arranged holes is used.

FIG. 11 shows an example using the high-pressure rinsing nozzle 20a which has a number of high-pressure rinsing liquid jet out holes JH which are arranged linearly. Although FIG. 11 does not show the positions of the high-pressure rinsing spots, the illustrated structure is similar to the first preferred embodiment of FIG. 1 in that the high-pressure rinsing spots are set close to the ultrasonic rinsing line L and on such a side so as to be scanned before the ultrasonic rinsing line L scans the rotating substrate. In this case, of the high-pressure rinsing spots of the number of the high-pressure rinsing liquid jet out holes JH, one high-pressure rinsing spot is preferably set to coincide with the center of rotation CP. With such an arrangement, the swing width of an high-pressure rinsing nozzle 20a may become very narrow by arranging the high-pressure rinsing liquid jet out holes JH at small intervals, or swinging may be omitted. The respective nozzles can retract by means of revolution as that shown at the symbol $\theta_{11}$.

Figure 12:
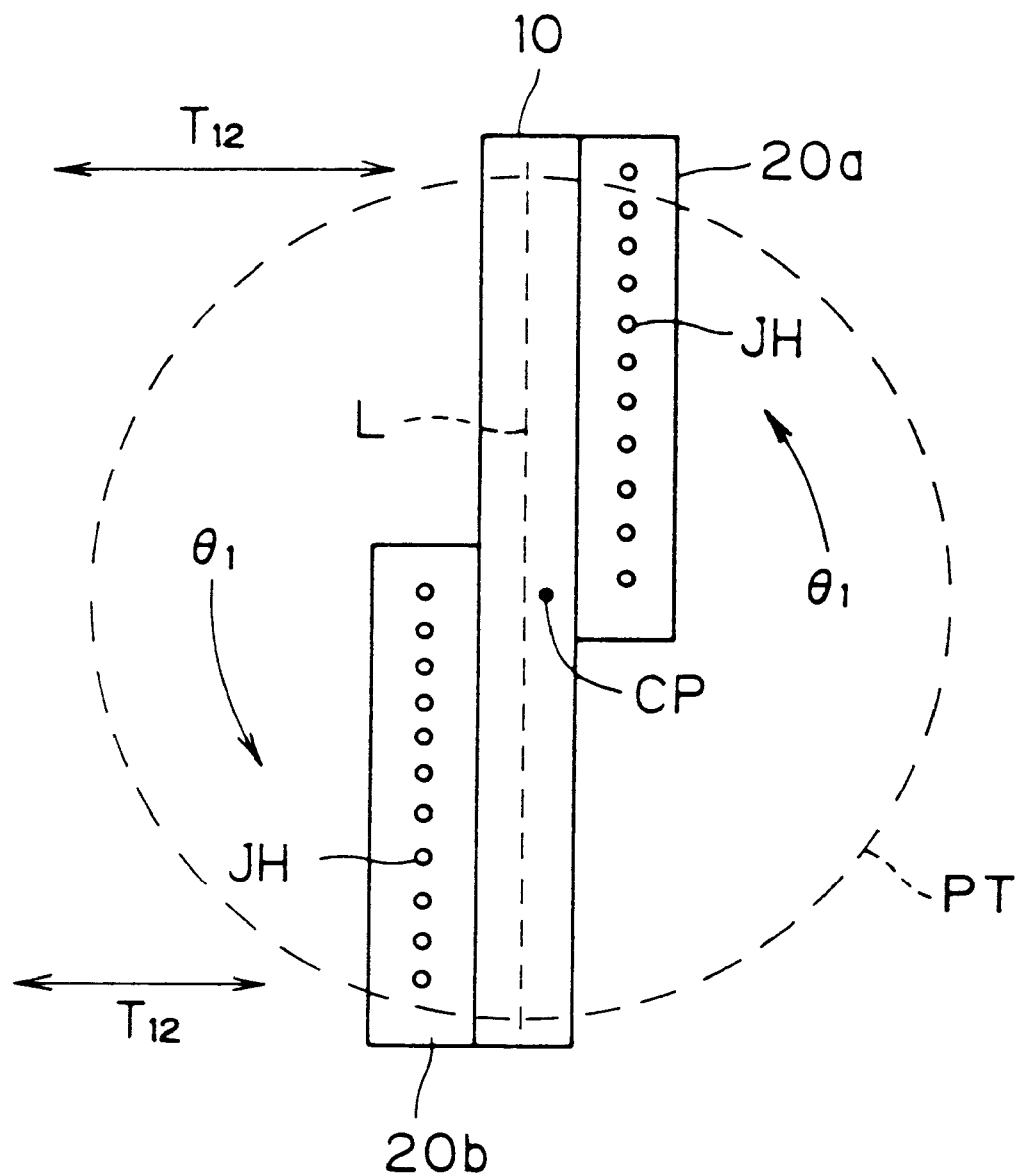
FIG. 12 is a view showing another example where a high-pressure rinsing nozzle having a number of arranged holes is used.

FIG. 12 shows an example where high-pressure rinsing nozzle arrangements 20a and 20b are disposed at the both ends of the ultrasonic rinsing nozzle 10 whose length entirely covers the substrate. In this case as well, it is preferable that the high-pressure rinsing nozzle arrangements 20a and 20b are disposed on the side which is subjected to scanning earlier as the substrate rotates and that one of the high-pressure rinsing spots of the high-pressure rinsing liquid jet out holes JH forming these nozzle arrangements coincides with the center of rotation CP. Retracting of the nozzles may be realized by translation as that indicated at the symbol $T_{12}$ in such an arrangement.

Although it is preferable to perform high-pressure rinsing with a beam-shaped jet as in the first preferred embodiment described above, a slit may be used to perform high-pressure rinsing with a curtain-shaped jet.

The present invention is applicable not only to rinsing of a glass substrate for a liquid crystal display apparatus, but to rinsing of various types of substrates, such as a semiconductor wafer, which are mainly for use in electric devices.

3. Second Preferred Embodiment

<3-1. Mechanical Structure>

Figure 13:
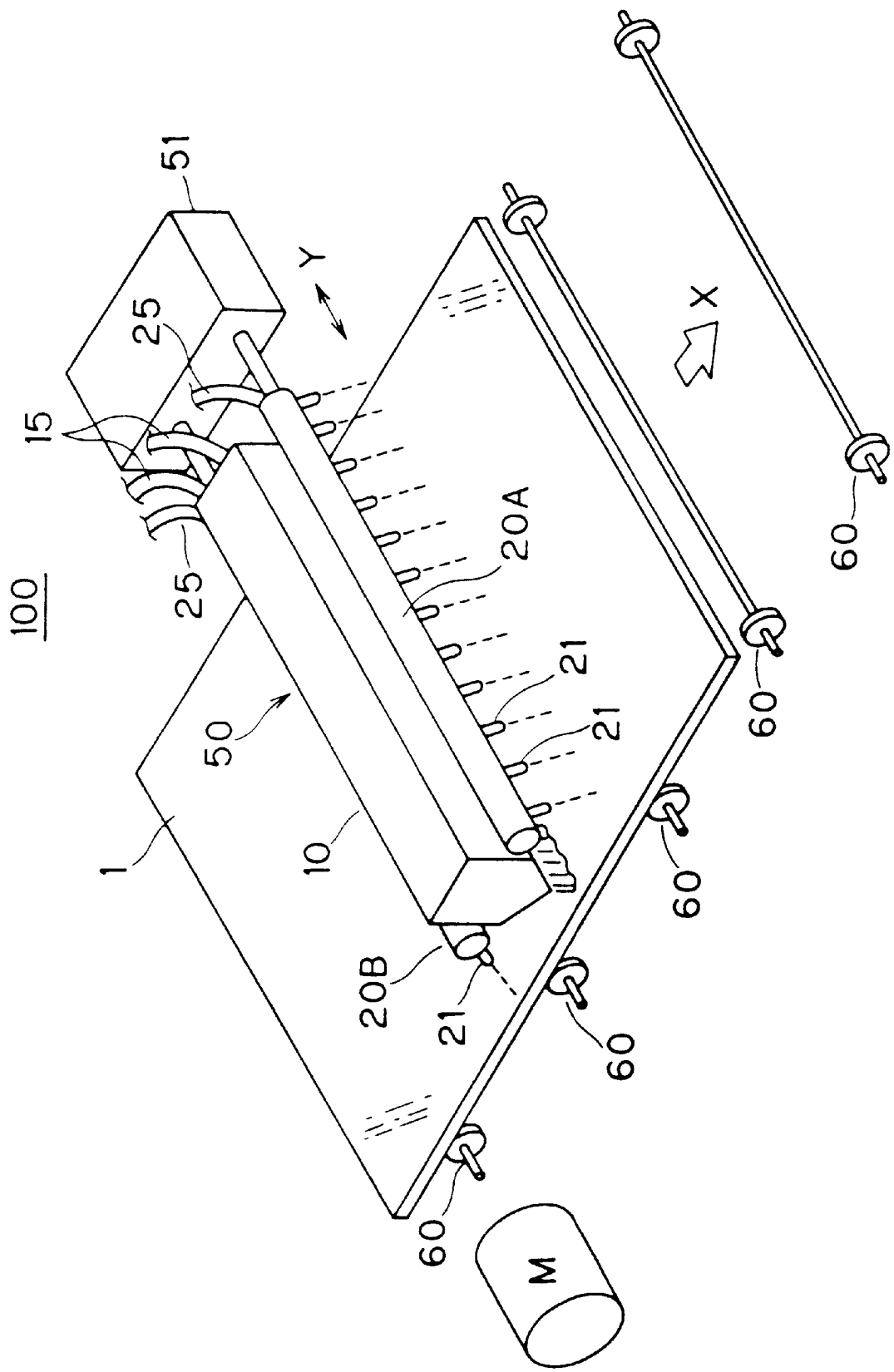
FIG. 13 is an essential perspective view of a substrate rinsing apparatus according to a second preferred embodiment of the present invention.

FIG. 13 is an essential perspective view of a substrate rinsing apparatus according to a second preferred embodiment of the present invention. This substrate cleaning apparatus 100 is structured for performing combined rinsing, i.e., ultrasonic rinsing and high-pressure rinsing parallel in time on the substrate 1 while translating the glass substrate 1 for a liquid crystal display apparatus and the combined cleaning mechanism 50 relative to each other. First, the substrate which is to be cleaned is translated in a direction X in FIG. 13 by arranged rollers 60. While a motor M is disposed to realize translating, for convenience in illustration, FIG. 13 omits linkage between the motor M and the transport rollers.

The combined cleaning mechanism 50 is disposed above a transportation path for the substrate 1. The combined cleaning mechanism 50 is constructed by arranging the high-pressure rinsing nozzles 20A and 20B near the both ends of the ultrasonic rinsing nozzle 10. Of the nozzles, the ultrasonic rinsing nozzle 10 has such an internal structure which will be described in detail later and is fixed by a stationary arm not shown externally to the substrate 1. The length of the ultrasonic rinsing nozzle 10 is equal to the Y-direction width of the substrate 1 or longer. The ultrasonic rinsing nozzle 10 injects rinsing liquid as a curtain from the slit onto the substrate 1.

While FIGS. 2A and 2B shows the ultrasonic rinsing nozzle 10 according to the first preferred embodiment, as the apparatus according to the second preferred embodiment has the ultrasonic rinsing nozzle 10 of a similar shape, in the following, the ultrasonic rinsing nozzle 10 according to the second preferred embodiment will be described with reference to FIGS. 2A and 2B.

FIG. 2A is a conceptual front view of the ultrasonic rinsing nozzle 10 in perspective, while FIG. 2B is a conceptual (partial) plan view of the ultrasonic rinsing nozzle 10 in perspective. In the ultrasonic rinsing nozzle 10, an ultrasonic wave is emitted from the ultrasonic wave oscillator 11 onto rinsing liquid F which is injected through the rinsing liquid inlet 12 and the rinsing liquid F is jetted out through the slit 13 which is disposed beneath.

A high frequency oscillating voltage is supplied to the ultrasonic wave oscillator 11. Preferably, the frequency of the supplied voltage is in the range of:

0.8 MHz–2.0 MHz

More preferably, the range is:

1.2 MHz–1.8 MHz

The rinsing liquid inlet 12 is linked to the resin tube 15 (See FIG. 13). The tube 15 is linked to the rinsing liquid supply part.

On the other hand, each one of the high-pressure rinsing nozzles 20A and 20B shown in FIG. 13 has an one-dimensional arrangement of needle-shaped nozzle tips 21 each having a jet out hole which is shaped as circle in cross section (Only some of the nozzle tips 21 are indicated at 21 in FIG. 13.). The nozzle tips 21 jet out high-pressure jet rinsing liquid, which is supplied from the high-pressure rinsing liquid supply part through a resin tube 25, in the form close to a beam onto a surface of the substrate 1. In each one of the high-pressure rinsing nozzles 20A and 20B, the length of the arrangement of the nozzle tips 21 is equal to the Y-direction width of the substrate 1 or longer.

The pressure of the high-pressure rinsing liquid which is supplied to the high-pressure rinsing nozzles 20A and 20B is preferably in the range of:

5 kg/cm$^2$–15 kg/cm$^2$

Further preferably, the pressure is in the range of:

8 kg/cm$^2$–10 kg/cm$^2$

Further, each one of the high-pressure rinsing nozzles 20A and 20B is linked to an swing actuator 51 which uses a link mechanism or the like. The swing actuator 51 swings the high-pressure rinsing nozzles 20A and 20B at a predetermined swinging amplitude along the direction Y which is perpendicular to the translating direction X in which the substrate 1 translates, namely, the direction of the arrangement of the nozzle tips 21. The swinging amplitude is approximately equal to or larger than the intervals of the nozzle tips 21 in the direction Y. However, since it is possible to perform high-pressure rinsing entirely over the substrate 1 in the direction Y without oscillating the nozzles when the nozzle tips 21 are arranged dense in the direction Y or when the high-pressure rinsing nozzles 20A and 20B are slit-shaped, the oscillation actuator 51 may be omitted and the high-pressure rinsing nozzles 20A and 20B may be fixed externally to the substrate 1.

Figure 14:
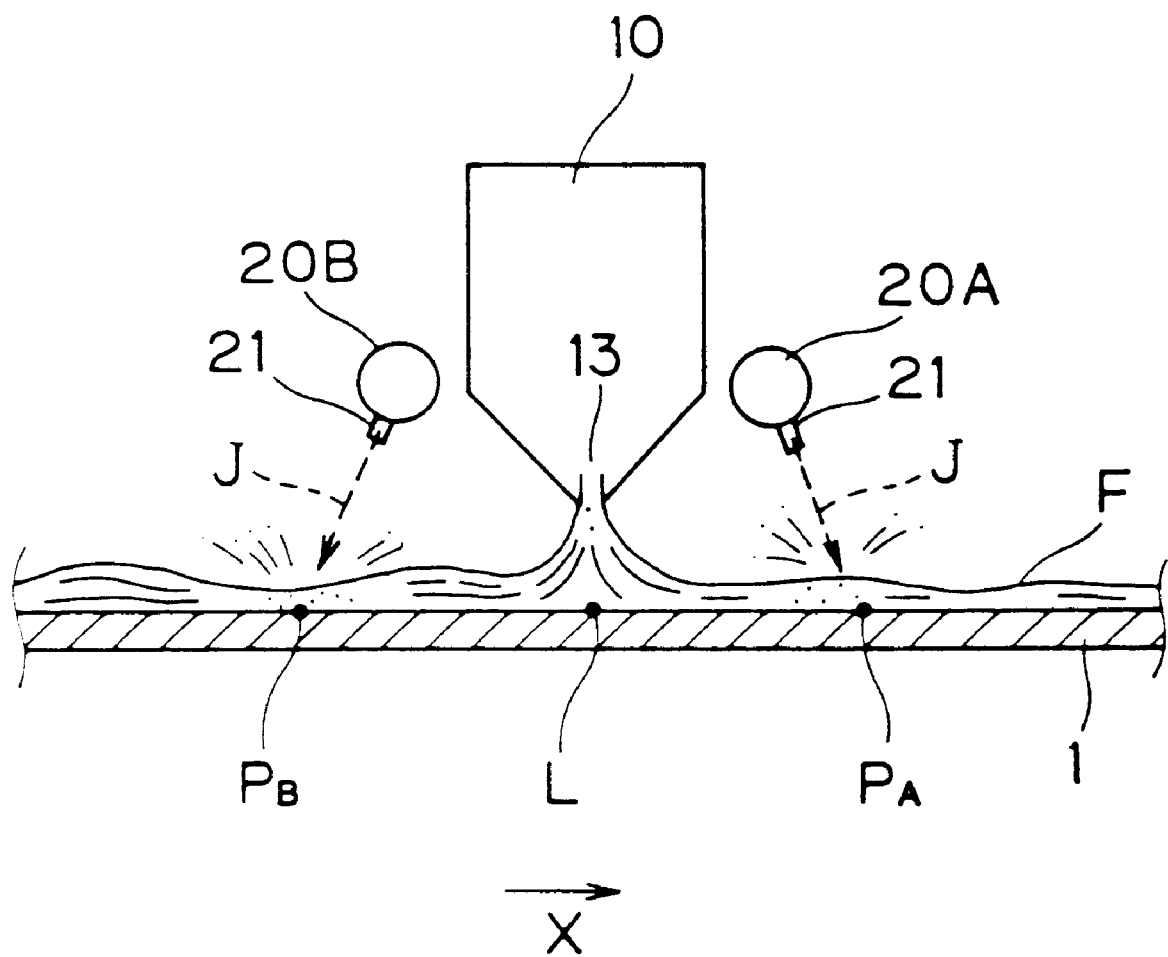
FIG. 14 is an enlarged view showing a positional relationship between nozzles as it is viewed from a direction which is perpendicular to an elongated direction of an ultrasonic rinsing nozzle.

FIG. 14 is a view showing a positional relationship between the ultrasonic rinsing nozzle 10 and the high-pressure rinsing nozzles 20A and 20B within the apparatus 100. The ultrasonic rinsing nozzle 10 is disposed in such a manner that the ultrasonic rinsing liquid F is injected as a curtain toward the imaginary ultrasonic rinsing line L which is imaginarily defined at the surface of the substrate 1. The injection direction is approximately right angles with respect to the surface of the substrate 1.

On the other hand, the high-pressure rinsing nozzles 20A and 20B are disposed at the both sides of the ultrasonic rinsing nozzle 10, so as to jet out a jet of the high-pressure rinsing liquid in an angled direction away from the injection direction in which the ultrasonic rinsing liquid F is injected from the ultrasonic rinsing nozzle 10. The axial line of this injection is toward the imaginary high-pressure rinsing spots $P_A$ and $P_B$ which are imaginarily defined at the surface of the substrate 1.

Figure 15:
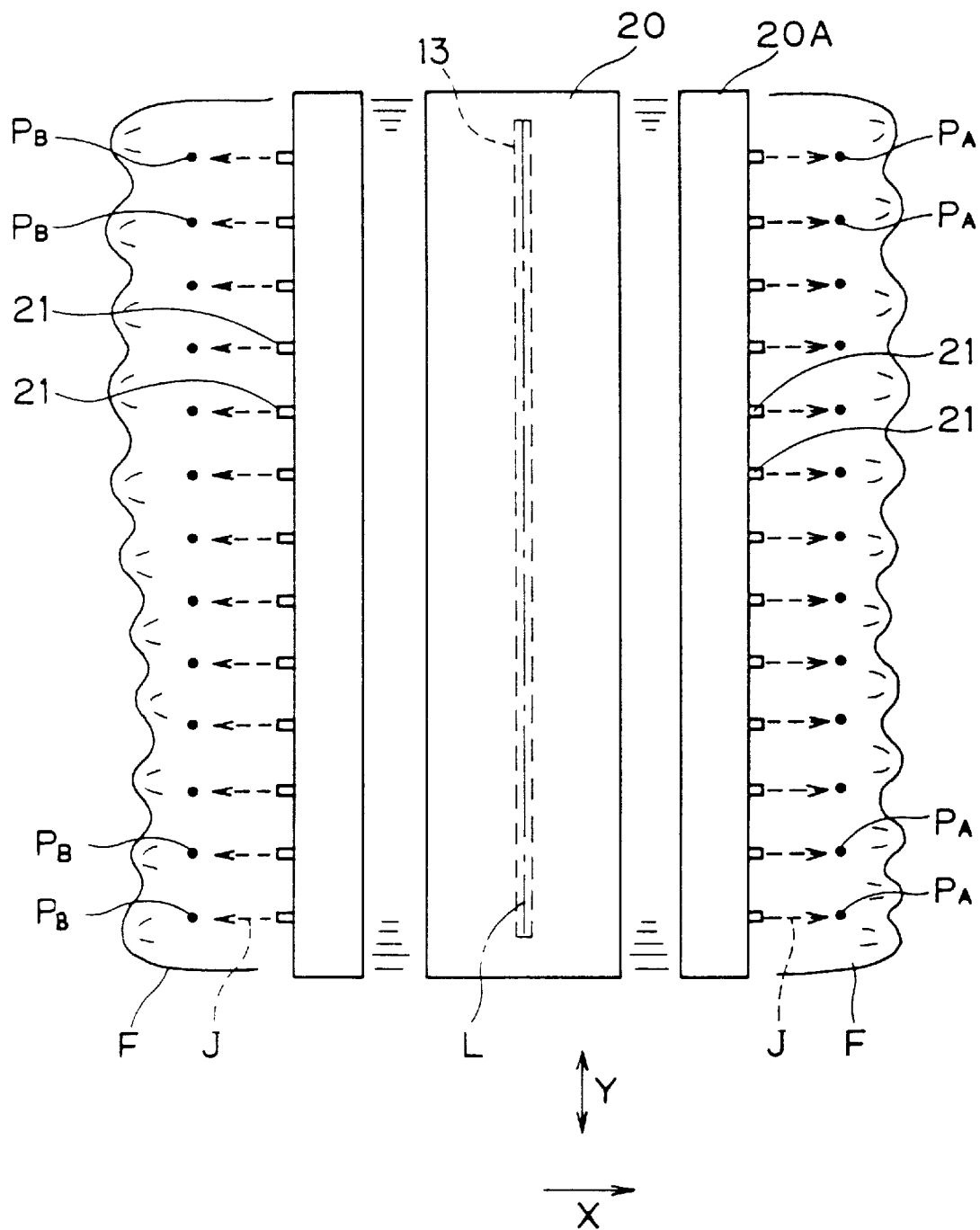
FIG. 15 is a conceptual plan view showing the positional relationship between the nozzles as it is viewed from above.

FIG. 15 shows such a positional relationship as a plan view. As described with reference to FIG. 14, since the ultrasonic rinsing line L is immediately below the slit 13 of the ultrasonic rinsing nozzle 10, the ultrasonic rinsing line L is under the slit 13 in FIG. 15. Further, since each one of the high-pressure rinsing nozzles 20A and 20B has a number of the nozzle tips 21, the high-pressure rinsing spots $P_A$ are in an one-dimensional arrangement and so the high-pressure rinsing spots $P_B$ are. The high-pressure rinsing spots $P_A$ and $P_B$ are arranged parallel to and in the vicinity of the ultrasonic rinsing line L.

<3-2. Brief Description Of Operation>

Before describing a rinsing effect of the apparatus 100 in detail, a cleaning operation of the apparatus 100 will be generally described. First, the substrate 1 is transported from the left-upper direction in FIG. 13 to the direction X. Before a forward end of the substrate 1 comes close to the combined cleaning mechanism 50, the ultrasonic rinsing nozzle 10 starts injecting the ultrasonic rinsing liquid and the high-pressure rinsing nozzles 20A and 20B start jetting out the high-pressure rinsing liquid. In addition, the swing actuator 51 starts swinging the high-pressure rinsing nozzles 20A and 20B with the same swinging amplitude and the same phase.

The substrate 1, while transported in the direction X, is rinsed by combined rinsing combining ultrasonic rinsing and high-pressure rinsing. Combined rinsing is continued until a backward end of the substrate 1 passes the combined cleaning mechanism 50, and subsequently, the substrate 1 is transported further in the direction X and loaded into an apparatus which is disposed for the next step processing (such as a drying process).

<3-3. Details Of Combined Rinsing>

During combined rinsing according to the second preferred embodiment, as shown in FIG. 14, the jet J of the high-pressure rinsing is jetted out into the ultrasonic rinsing liquid F is injected from the ultrasonic rinsing nozzle 10. If an optional position within the substrate 1 is noted, the noted position is subjected to the high-pressure rinsing jet J from the high-pressure rinsing nozzle 20B, first, as the substrate is transported in the direction X. As there is a flow of the ultrasonic rinsing liquid F at the destination of the jet J, a foreign matter which is removed by high-pressure rinsing is washed away by the flow of the ultrasonic rinsing liquid F without adhering to the surface of the substrate 1 again. In addition, the high-pressure rinsing jet J moves within the ultrasonic rinsing liquid F as the high-pressure rinsing nozzles 20A and 20B are swung, and therefore, a bubbling-induced cavitation effect is created inside the rinsing liquid which is supplied onto the surface of the substrate. This further enhances the rinsing effect.

As transportation in the direction X progresses, the optional position described above on the substrate 1 comes immediately below the ultrasonic rinsing nozzle 10, to be subjected to ultrasonic rinsing. A foreign matter which is removed by ultrasonic rinsing as well is carried away by the flow of the ultrasonic rinsing liquid F.

As transportation in the direction X further progresses, the optional position described above on the substrate 1 is subjected to high-pressure rinsing by the high-pressure rinsing nozzle 20A. The effect of this second high-pressure rinsing is similar to that of the first high-pressure rinsing. The transportation speed for transporting the substrate in the direction X is slower than the oscillation speed for oscillating the high-pressure rinsing nozzles 20A and 20B. In the plan view in FIG. 15, even a portion within the surface of the substrate 1 which is located off the direction Y from the high-pressure rinsing spots $P_A$ and $P_B$ is subjected to high-pressure rinsing as the high-pressure rinsing nozzles 20A and 20B oscillate.

By the way, if the high-pressure rinsing jet J is jetted out toward the ultrasonic rinsing line L, the flow of the high-pressure rinsing jet J disturbs transmission of an ultrasonic wave upon the ultrasonic rinsing liquid F.

Further, since the quantity of the ultrasonic rinsing liquid F is quite large at the position of the ultrasonic rinsing line L, disturbed by an excessive quantity of the ultrasonic rinsing liquid F, the high-pressure rinsing jet J may not reach at the surface of the substrate 1 at an excellent efficiency.

The second preferred embodiment deals with this, as the high-pressure rinsing jets J are jetted out toward the high-pressure rinsing spots $P_A$ and $P_B$ which are set at positions which are in the vicinity of but a little away from the ultrasonic rinsing line L in the second preferred embodiment, and therefore, the quantity of the ultrasonic rinsing liquid F is appropriate at these positions and the efficiency of high-pressure rinsing is particularly high.

On the other hand, the structure requiring the direction of the high-pressure rinsing jets J from the high-pressure rinsing nozzles 20A and 20B to be off the ultrasonic rinsing line L is related to an improvement in the effect of discharging a foreign matter which is removed by high-pressure rinsing. Taking the high-pressure rinsing nozzle 20B as an example, a foreign matter which is removed by high-pressure rinsing, due to the force of the high-pressure rinsing jet J, has a velocity component in the left-hand direction in FIG. 14 (i.e., the direction of the flow of the ultrasonic rinsing liquid F). Added to the flow of the ultrasonic rinsing liquid F, the velocity component aids discharging of a foreign matter outside the substrate 1. The effect of discharging a removed foreign matter is further enhanced in this manner. With respect to the high-pressure rinsing jet J from the other high-pressure rinsing nozzle 20A as well, this function is improved in a similar manner only with the directions reversed.

Figure 16:
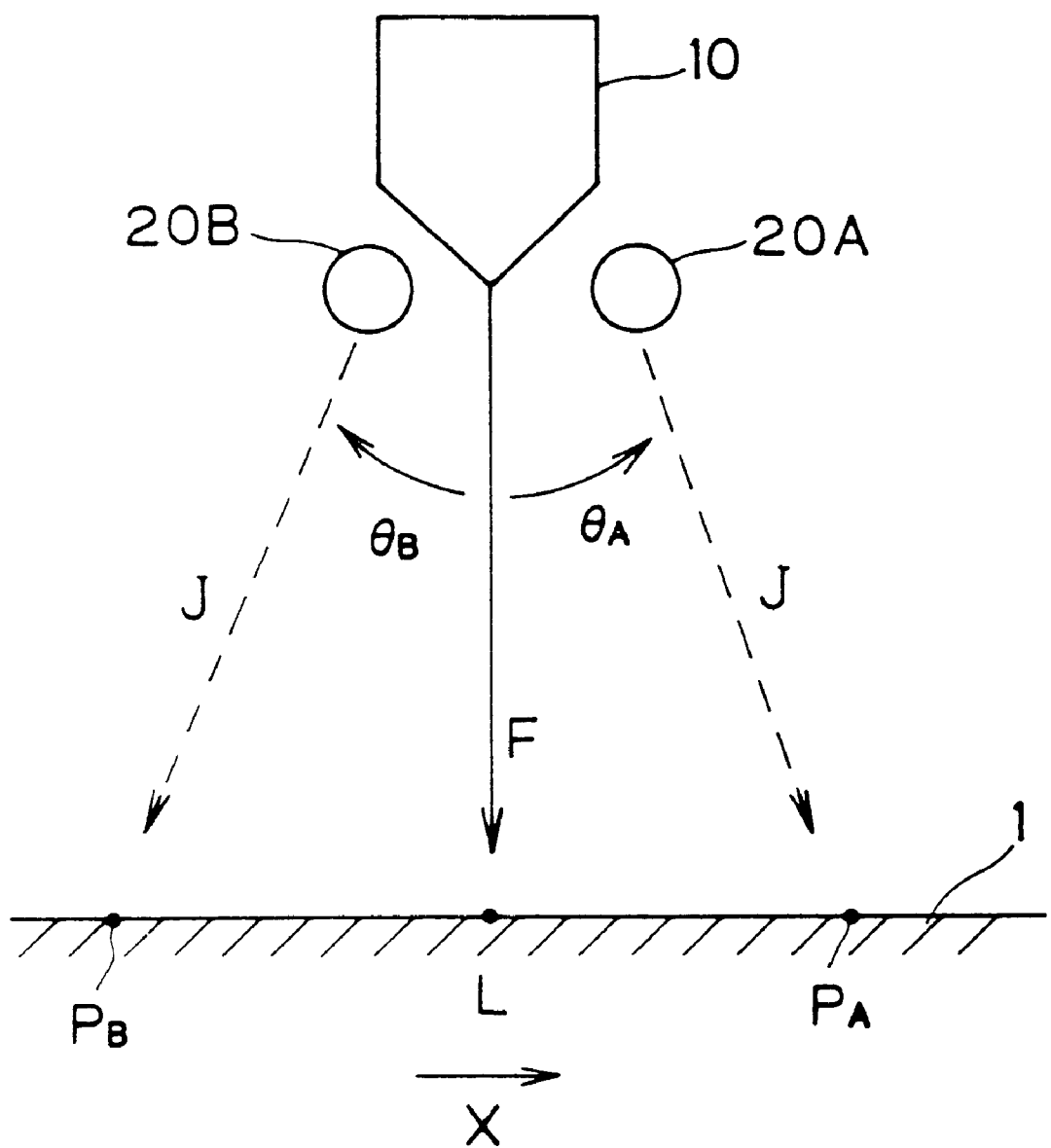
FIG. 16 is an explanatory view showing an ejection direction in which an ultrasonic rinsing nozzle discharges ultrasonic rinsing liquid and the position of an injection direction in which high-pressure rinsing nozzles inject a high-pressure rinsing jet.

FIG. 16 generalizes a relationship between the high-pressure rinsing jets J and the injection direction of injecting the ultrasonic rinsing liquid which is necessary to realize such a function. For the reason described above, the angles $\theta_A$ and $\theta_B$ of the high-pressure rinsing jets J from the high-pressure rinsing nozzles 20A and 20B with respect to the injection direction of injecting the ultrasonic rinsing liquid preferably have positive values. It is however possible to set $\theta_A=0$ and $\theta_B=0$ to ensure maximum use of the jet pressure if the high-pressure rinsing jets J are injected to the surface of the substrate 1 at right angles. Although this does not aid discharging of a foreign matter which is removed by high-pressure rinsing, with respect to the function that a removed foreign matter is not carried back toward the ultrasonic rinsing line L, this is as excellent as the case described above where the angles $\theta_A$ and $\theta_B$ have positive values.

Further, even if the angles $\theta_A$ and $\theta_B$ have negative values, the effects of the present is not denied. However, it is desirable that the angles $\theta_A$ and $\theta_B$ have positive values as described above. When the angles $\theta_A$ and $\theta_B$ have positive values, the upper limit on the values of the angles $\theta_A$ and $\theta_B$ is determined in accordance with the minimum jet pressure which is necessary for removal of a foreign matter from the substrate 1.

4. Third Preferred Embodiment

<4-1. Difference Between Third Preferred Embodiment And Second Preferred Embodiment>

Figure 17:
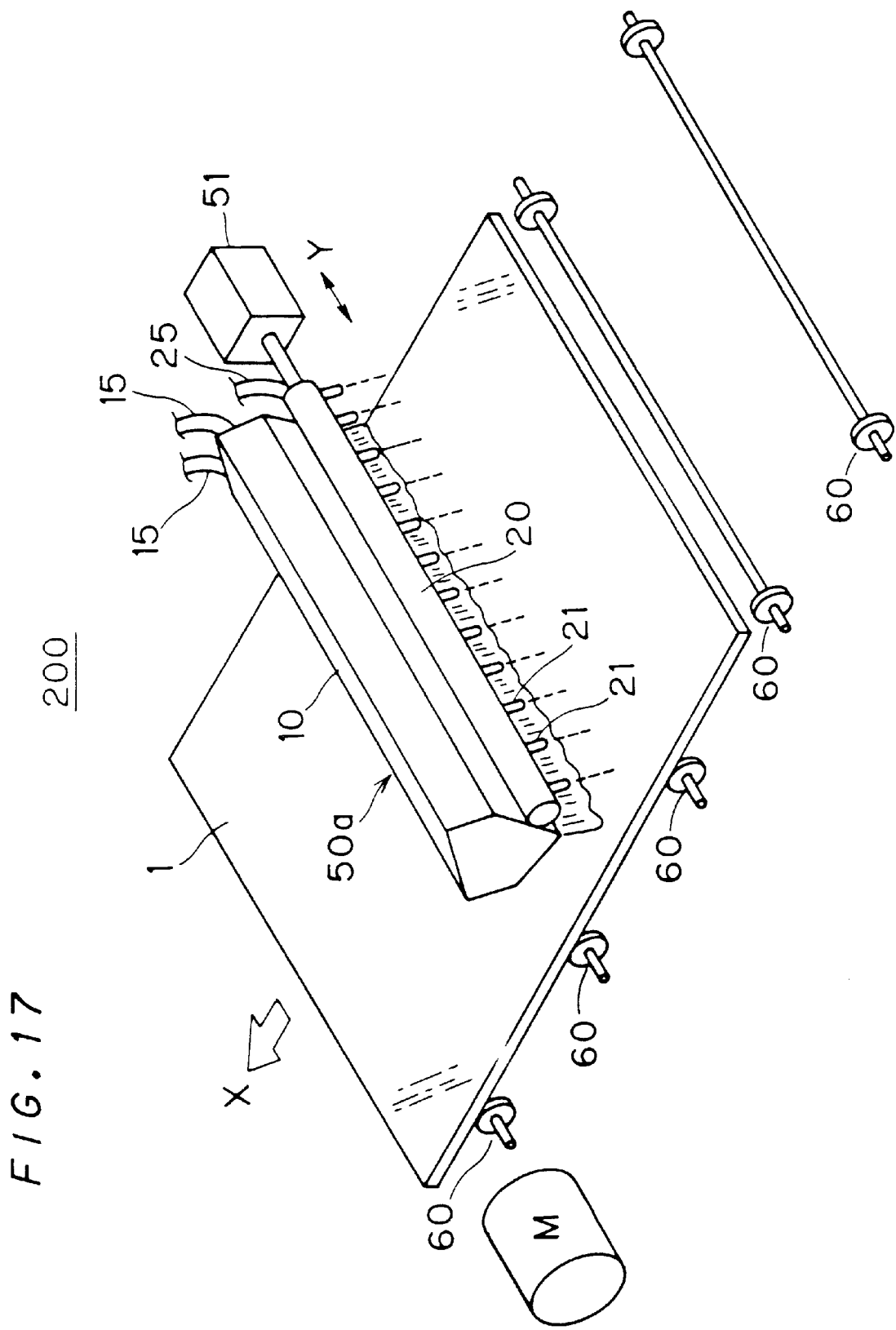
FIG. 17 is an essential perspective view of a substrate rinsing apparatus according to a third preferred embodiment of the present invention.

FIG. 17 is an essential perspective view of a substrate cleaning apparatus 200 according to a third preferred embodiment of the present invention. In the following, the apparatus 200, mainly its difference from the apparatus 100 of FIG. 13, will be described.

Figure 18:
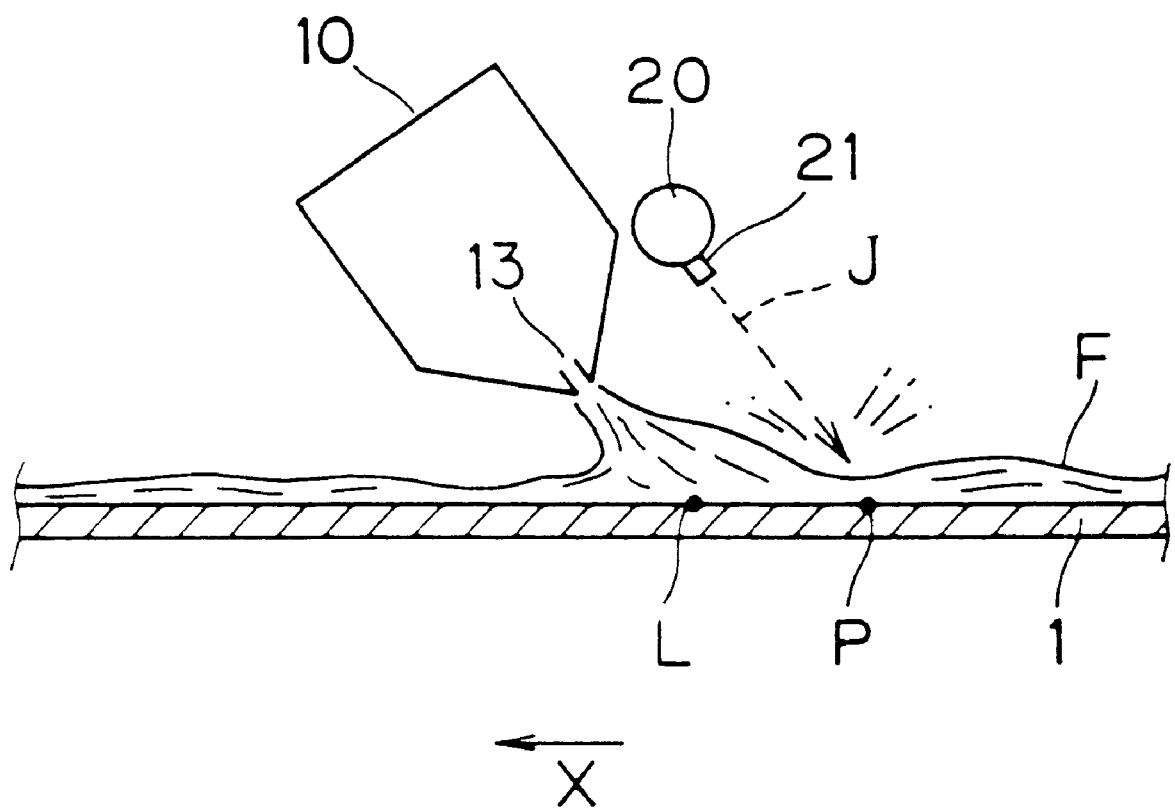
FIG. 18 is an enlarged view showing a positional relationship between nozzles as it is viewed from a direction which is perpendicular to an elongated direction of an ultrasonic rinsing nozzle.
Figure 19:
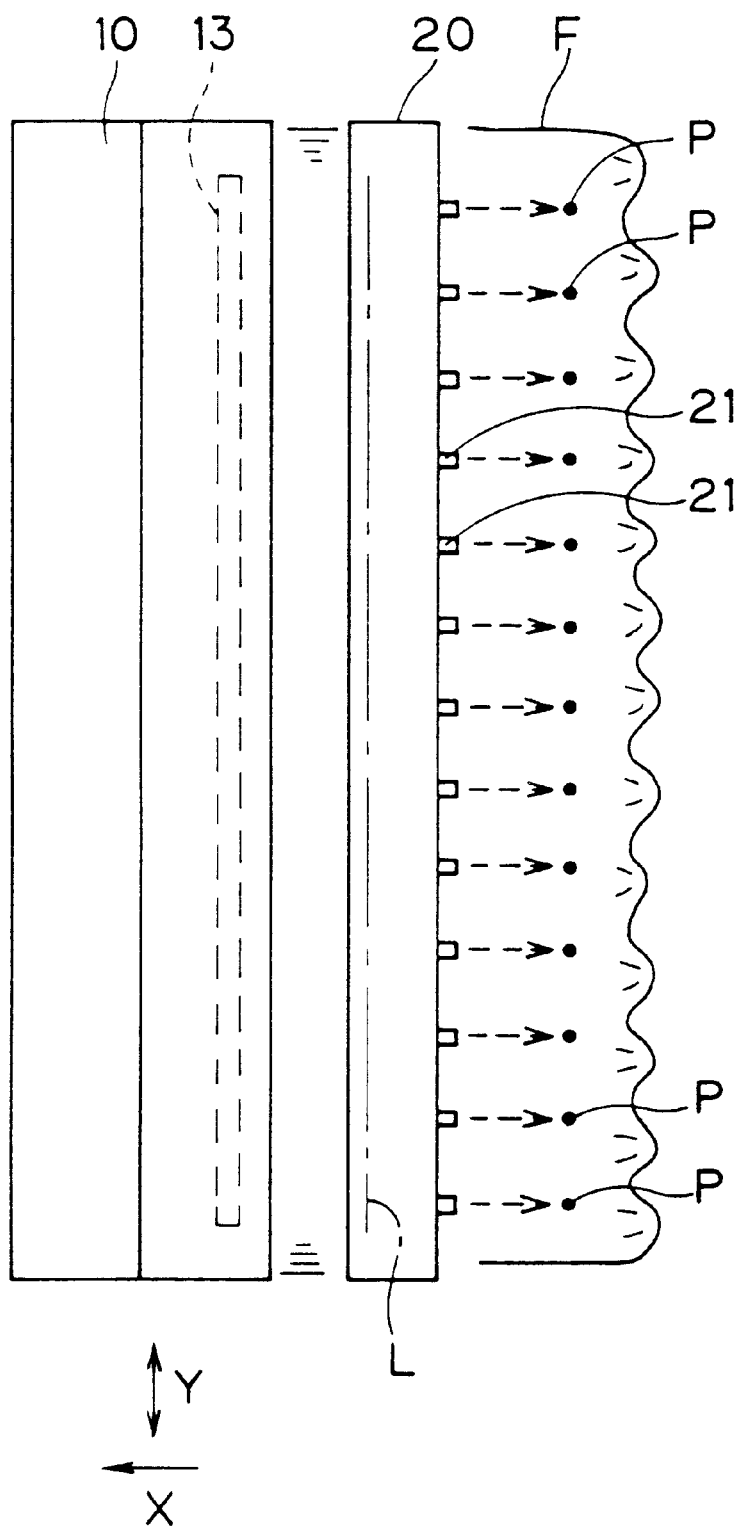
FIG. 19 is a conceptual plan view showing the positional relationship between the nozzles as it is viewed from above.

The apparatus 200 shown in FIG. 17 requires that in a combined cleaning mechanism 50a, the ultrasonic rinsing nozzle 10 is at an angle opposite to the direction X in which the substrate 1 is transported. The high-pressure rinsing nozzle 20 is disposed only on the opposite side to the direction X in which the substrate 1 is transported. Further, as shown in FIG. 18, the direction in which the ultrasonic rinsing nozzle 10 injects the ultrasonic rinsing liquid F is inclined at an angle opposite to the direction X for transporting the substrate 1, the high-pressure rinsing jet J from the high-pressure rinsing nozzle 20 is inclined at a similar angle, and the arrangement of the high-pressure rinsing spots P is set at such a position so as to scan the substrate 1 in the direction X before the ultrasonic rinsing line L scans the substrate 1. This is illustrated in the plan view showing the nozzles in FIG. 19.

Referring to FIG. 18 again, with such a relationship as to arrangement, an optional position within the substrate 1 is subjected to high-pressure rinsing, first, and thereafter to ultrasonic rinsing. Although the present embodiment does not prohibit to reverse this order, the arrangement as that shown in FIG. 18 particularly prevents a foreign matter which is removed by the high-pressure rinsing jet J from returning near the ultrasonic rinsing line L, and also enhances the efficiency of ultrasonic rinsing.

Plan Area Size Of Substrate 1 . . . 360 mm×465 mm;

Transportation Speed Of Substrate 1 . . . 1.2 m/min;

Size And The Number Of Nozzle Tips 21 Of High-Pressure Rinsing Nozzle 20 . . . 18 Nozzle Tips Having Injection Diameter Of 0.1 mm φ;

Supplied Jet Pressure To High-Pressure Rinsing Nozzle 20 . . . 15 kgf/cm$^2$;

Ultrasonic Wave Power In Ultrasonic Rinsing Nozzle 10 . . . 500 W;

Flow Rate Of Ultrasonic Rinsing Liquid In Ultrasonic Rinsing Nozzle 10 . . . 30 liters/min;

Measuring Method . . . counting the number of particles which are 1 μm or larger before and after rinsing

TABLE 2

| RINSING METHOD | THE NUMBER OF PARTICLES | | | THE NUMBER OF RESIDUAL ADHERING PARTICLES D | REMOVAL RATE OF RINSING E |
| --- | --- | --- | --- | --- | --- |
| | INITIAL SUBSTRATE A | PARTICLES AFTER ADHERED(*) B | AFTER RINSING C | | |
| ONLY HIGH-PRESSURE JET RINSING | 302 | 5093 | 909 | 607 | 87.33% |
| ONLY ULTRASONIC RINSING | 382 | 4603 | 795 | 413 | 90.22% |
| BOTH HIGH-PRESSURE JET RINSING AND ULTRASONIC RINSING (PREFERRED EMBODIMENTS OF PRESENT INVENTION) | 345 | 4543 | 660 | 315 | 92.50% |

D = C − A
E = [(B − D)/B] × 100(%)
(*)The number of particles in a condition that particles are additionally adhered to an initial substrate.

Figure 20:
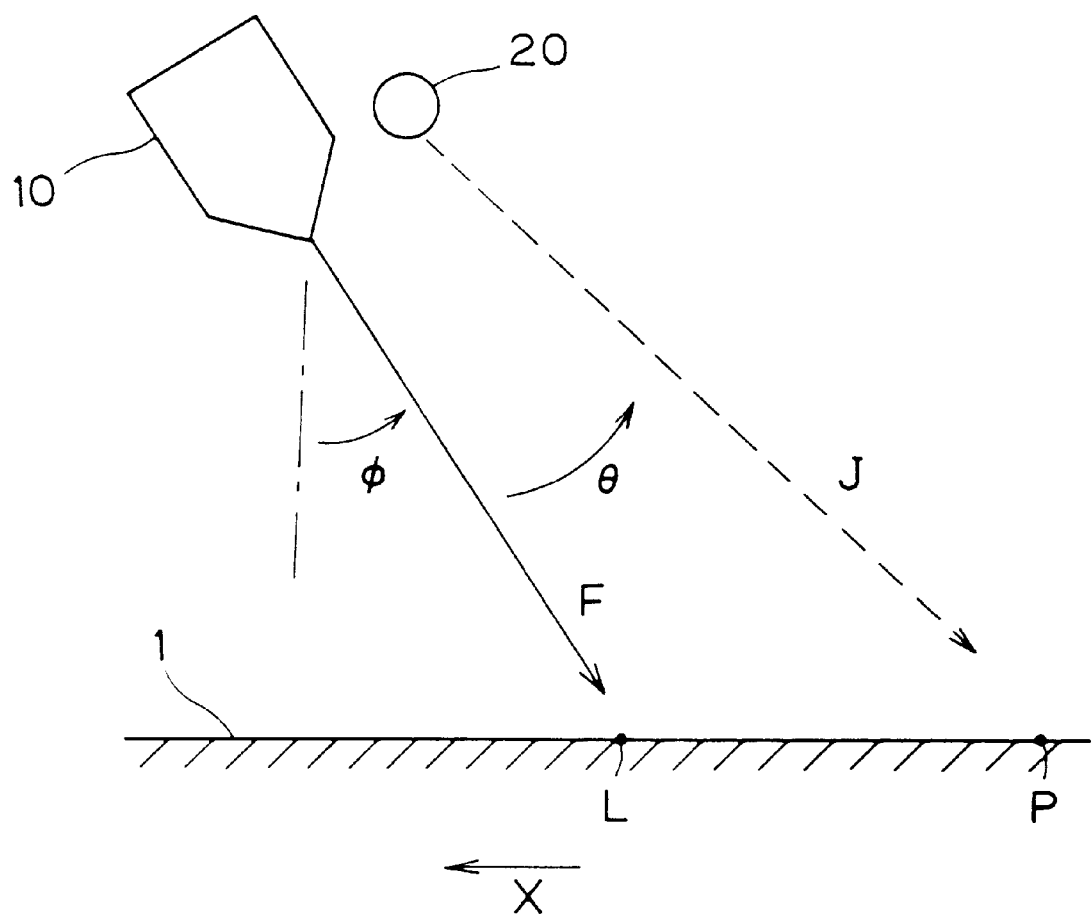
FIG. 20 is an explanatory view showing an ejection direction in which an ultrasonic rinsing nozzle discharges ultrasonic rinsing liquid and the position of an injection direction in which high-pressure rinsing nozzles inject a high-pressure rinsing jet.

FIG. 20 should be referred to regarding an angular relationship between the respective types of rinsing. In FIG. 20, the angle φ is an angle of the injection direction of injecting the ultrasonic rinsing liquid with respect to the perpendicular line, and another angle θ is an angle of the high-pressure rinsing jet J with respect to the injection direction of injecting the ultrasonic rinsing liquid. The angle φ is set as a positive value. As a foreign matter which is removed by ultrasonic rinsing is carried toward the right-hand side in FIG. 20 as the substrate 1 is transported in the direction X, this creates an effect that the removed foreign matter does not return to the ultrasonic rinsing line L. Further, the angle θ is preferably zero or a positive value, as this helps a foreign matter which is removed by high-pressure rinsing flow in the opposite direction to the transportation direction X. The upper limit on a positive value of the angle θ is defined in accordance with a jet pressure which is necessary at the surface of the substrate 1.

A general effect of combined rinsing combining ultrasonic rinsing and high-pressure rinsing in the apparatus 200 shown in FIG. 17 having such a structure is similar to that of the apparatus 100 of FIG. 13. Since the apparatus 200 shown in FIG. 17 is otherwise similar in structure to the apparatus 100 of FIG. 13, a redundant description will be simply omitted.

<4-2. Example Of Third Preferred Embodiment>

Table 2 shows a result confirming the rinsing effect of the apparatus according to the third preferred embodiment shown in FIG. 17. For comparison, Table 2 shows a case (1) that only high-pressure jet rinsing is performed and a case (2) that only ultrasonic rinsing is performed. Conditions for experiments are as follows:

Type Of Substrate 1 . . . a glass substrate for a liquid crystal display apparatus, with a chromium film formed at a surface;

As seen in Table 2, parallel use of a high-pressure jet and an ultrasonic wave according to the third preferred embodiment of the present invention enhances the effect of removing particles more than where only one of a high-pressure jet and an ultrasonic wave is used.

Although a difference is about 2.3–5.2% in the removal rate, in the case of a glass substrate for a liquid crystal display apparatus, only a slight difference in the number of residual particles largely influence the yield of producing substrates after rinsing. Hence, the third preferred embodiment of the present invention produces a better result than when only one rinsing method is used.

5. Fourth Preferred Embodiment

Figure 21:
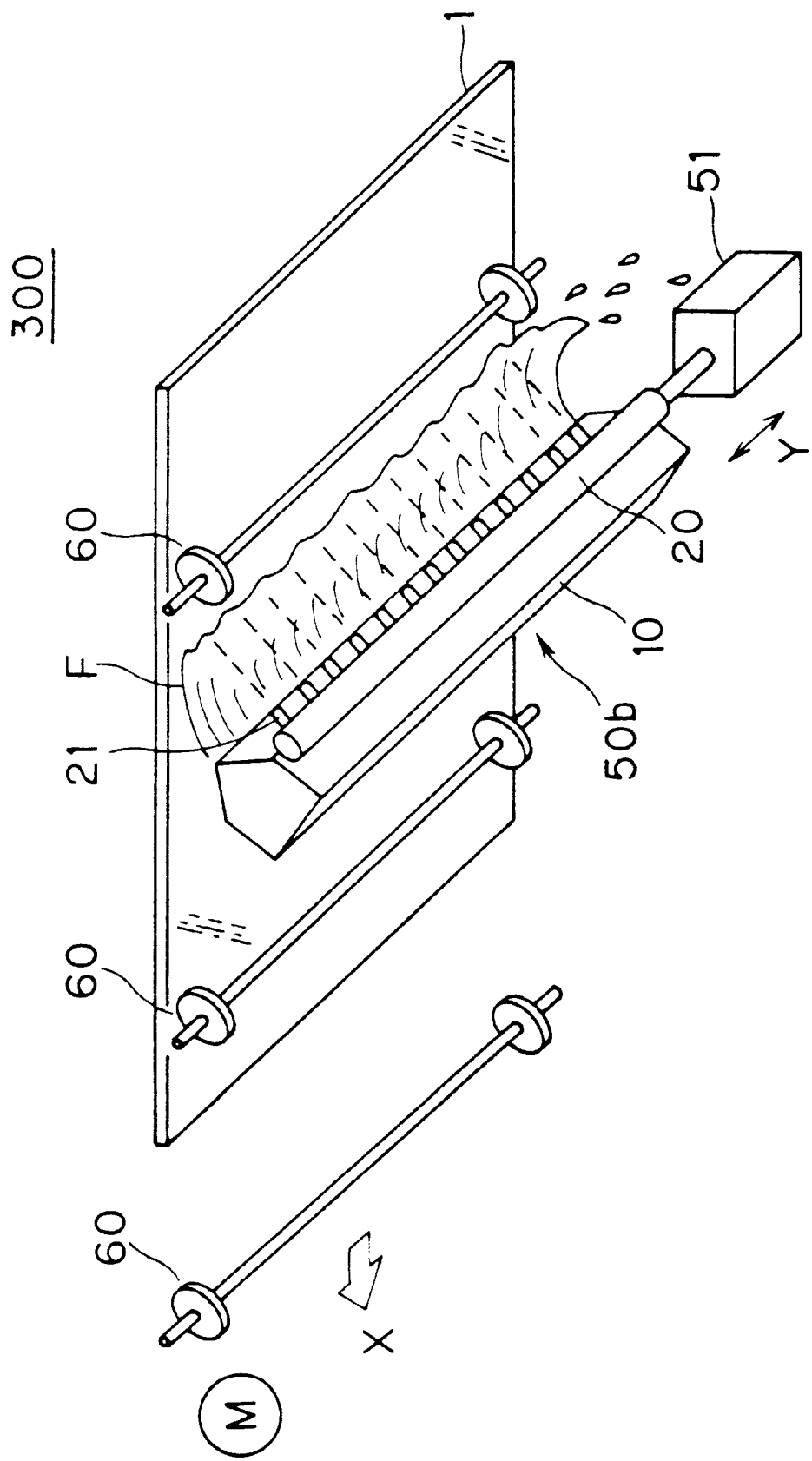
FIG. 21 is an essential perspective view of a substrate rinsing apparatus according to a fourth preferred embodiment of the present invention.

FIG. 21 is an essential perspective view of a substrate cleaning apparatus 300 according to a fourth preferred embodiment of the present invention, as it is viewed from below. The apparatus 300 is structured so as to rinse the back surface of the substrate 1. Mainly describing a difference from the second preferred embodiment, a combined cleaning mechanism 50b is disposed on the back surface side (i.e., downstream side) of the substrate 1 in the apparatus 300. The positional relationship between the ultrasonic rinsing nozzle 10 and the high-pressure rinsing nozzle 20 is equal to that in the apparatus 200 according to the third preferred embodiment shown in FIG. 17 with the positions of the nozzles reversed in the vertical direction in a symmetrical manner with respect to the plane of the substrate 1. However, to prevent interference with the combined rinsing mechanism 50b, the rollers 60 for transporting the substrate are disposed, avoiding positions around the combined rinsing mechanism 50b. Like FIG. 13, FIG. 21 only conceptually shows the motor M for driving the substrate 1.

Figure 22:
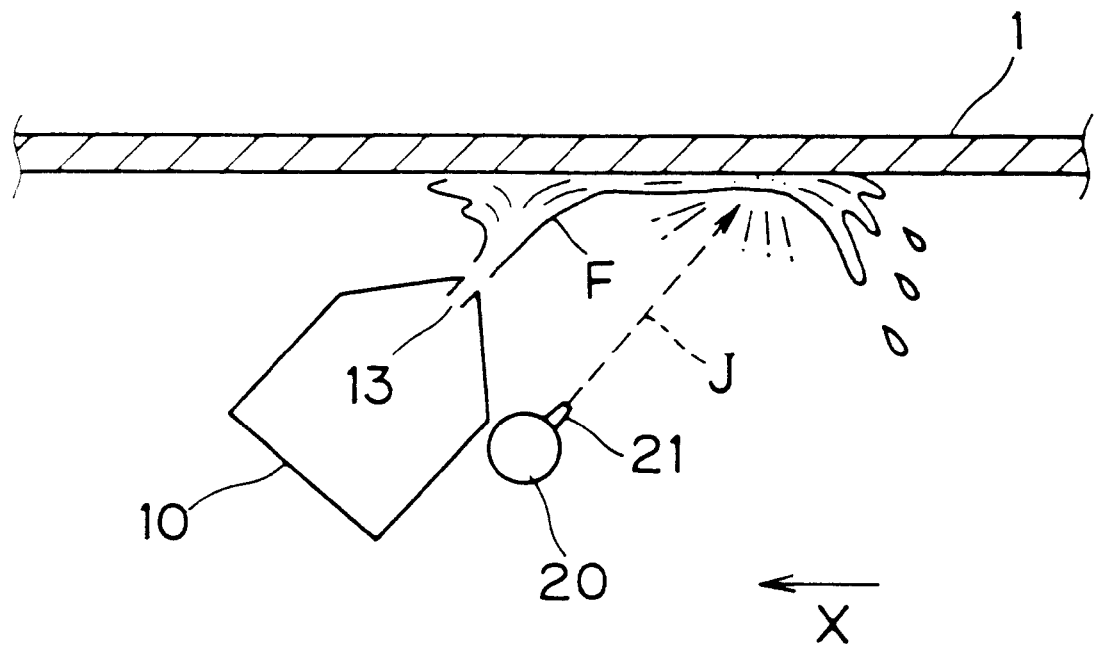
FIG. 22 is a view showing a positional relationship between nozzles.

The principles for rinsing in the apparatus 300 according to the fourth preferred embodiment are similar to those of the third preferred embodiment. However, since the ultrasonic rinsing liquid is injected up diagonally toward the back surface of the substrate 1, as shown in FIG. 22, due to surface tension, after flowing a certain distance along the back surface of the substrate 1, the ultrasonic rinsing liquid F falls off below the substrate 1. Hence, the high-pressure rinsing jet J is jetted out within a range in which the ultrasonic rinsing liquid F still flows along the back surface of the substrate 1.

Such back surface rinsing may be combined with surface rinsing of the second or the third preferred embodiment, thereby performing both-surface rinsing. Further, the substrate 1 may be transported in an upright posture and subjected to combined rinsing at the both surfaces.

6. Modified Examples Of Second To Fourth Preferred Embodiments

Figure 23:
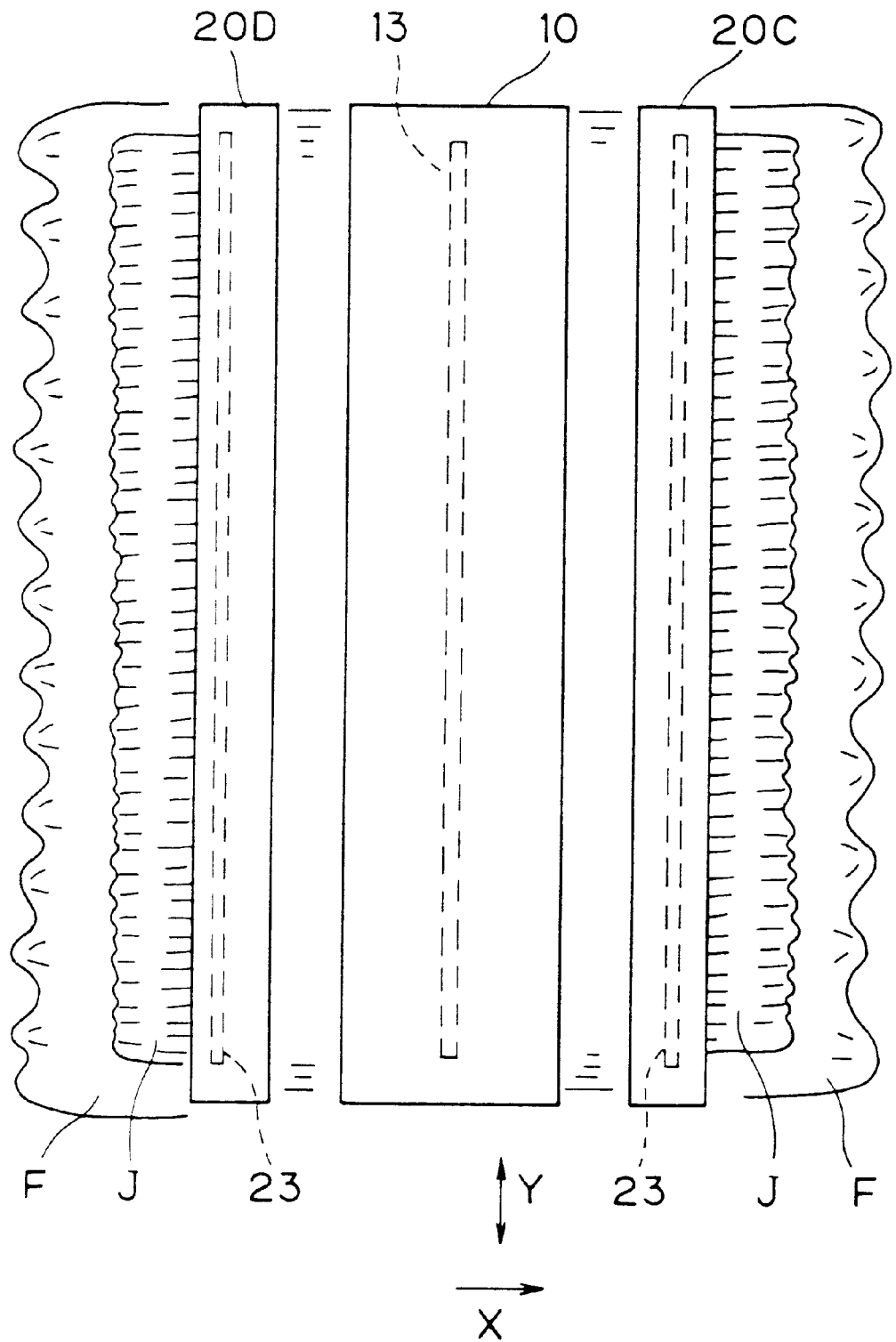
FIG. 23 is a conceptual plan view showing the positional relationship between the nozzles according to a modified example of the second to the fourth preferred embodiments.

FIG. 23 is a plan view showing the positional relationship between the nozzles according to a modified example of the second to the fourth preferred embodiments. High-pressure rinsing nozzles 20C and 20D according to the modified example jet out the high-pressure rinsing jets J through slits 23. While the structures of the second to the fourth preferred embodiments where a beam-shaped jet is jetted out are preferable for guaranteeing the pressure of the high-pressure rinsing jets J during injecting without increasing the pressure of the high-pressure jets on the supply side very much, the high-pressure rinsing jets J like a curtain through the slits 23 as those shown in FIG. 23 may be used as well. In this case, it is not necessary to oscillate the high-pressure rinsing nozzles 20C and 20D.

Figure 24:
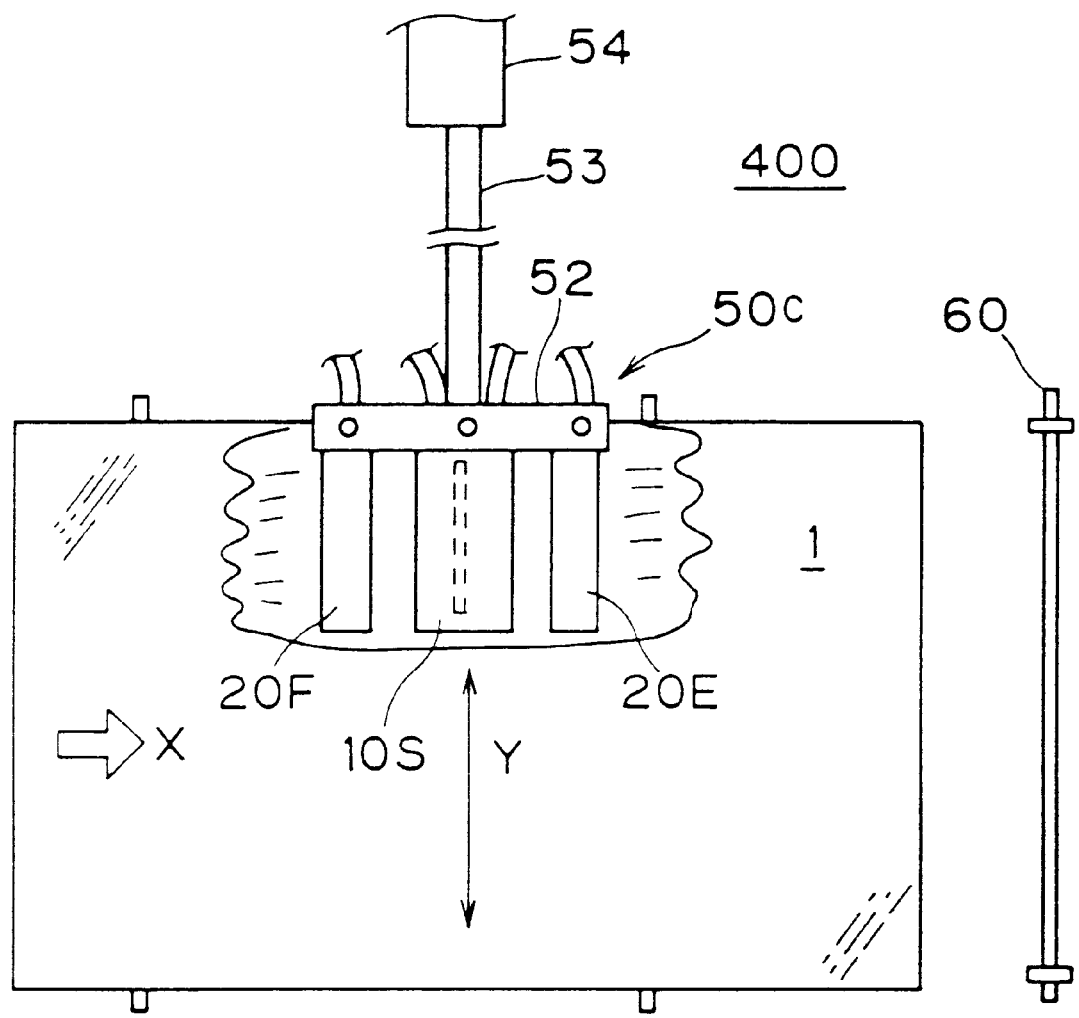
FIG. 24 is an essential plan view of other modified example of the second to the fourth preferred embodiments.

FIG. 24 is an essential plan view of other modified example. In FIG. 24, as an ultrasonic rinsing nozzle 10S and high-pressure rinsing nozzles 20E and 20F, a combined cleaning mechanism 50c uses nozzles which are shorter than the width of the substrate 1 in the direction Y. In this case, the linkage member 52 and the arm 53 are linked to swing actuator 54, so that the nozzles 10S, 20E and 20F are swung while scanning in the direction Y over the entire width of the substrate 1. Internal structures and functions of the nozzles 10S, 20E and 20F are similar to those of the second preferred embodiment. Further, the high-pressure rinsing nozzles having one high-pressure rinsing liquid jet out hole may be swung over the entire width of the substrate 1. As oscillation takes a considerable time if the substrate 1 is large in these modified examples, it is preferable that a plurality of (desirably a number of) high-pressure rinsing liquid jet out holes are formed and the oscillation width is not very large.

Although the second to the fourth preferred embodiments require to translate the substrate 1, the combined rinsing mechanism may be translated in the direction X or in the opposite direction. Alternatively, these two structures may be combined. Further, translation of the substrate and the combined rinsing mechanism relative to each other is not limited to one-side translation only in one direction but may be reciprocal translation.

In addition to rinsing of a glass substrate for a liquid crystal display apparatus, the present invention is applicable to rinsing of various types of substrates, such as a semiconductor wafer, which are mainly for use in electric devices.

While the invention has been described in detail, the foregoing description is in all aspects illustrative and not restrictive. It is understood that numerous other modifications and variations can be devised without departing from the scope of the invention.

We claim:

1. An apparatus for cleaning a substrate, comprising:
   a) ultrasonic cleaning means for emitting an ultrasonic wave onto a liquid while injecting said liquid toward said substrate so as to perform ultrasonic rinsing on said substrate; and
   b) high-pressure cleaning means disposed at a different position from said ultrasonic cleaning means, said high-pressure cleaning means including an ultrasonic rinsing nozzle jetting out high-pressure liquid toward said substrate at a pressure of higher than about 5 kg/cm$^2$ so as to perform high-pressure rinsing on said substrate, whereby combined rinsing is performed on the substrate by combining said ultrasonic rinsing and said high-pressure rinsing.

2. The apparatus of claim 1, further comprising c) substrate rotating means for rotating said substrate in a predetermined direction, wherein
   said combined rinsing is performed while rotating said substrate.

3. The apparatus of claim 1, wherein:
   said ultrasonic cleaning means comprises an ultrasonic rinsing nozzle for injecting said liquid, which is subjected to said ultrasonic wave, toward an ultrasonic rinsing line which is defined on a surface-to-be-cleaned of said substrate; and
   said high-pressure cleaning means jets out said high-pressure liquid toward a long region along said ultrasonic rinsing line on said surface-to-be-cleaned of said substrate.

4. The apparatus of claim 1, wherein said ultrasonic rinsing nozzle jets out said high-pressure liquid toward said substrate at a pressure of between 5 kg/cm$^2$–15 kg/cm$^2$.

5. An apparatus for cleaning a substrate, comprising:
   a) an ultrasonic cleaner injecting a liquid that has been subjected to an ultrasonic wave toward said substrate so as to perform ultrasonic rinsing on said substrate; and
   b) a high-pressure cleaner disposed at a different position from said ultrasonic cleaner, said high-pressure cleaner having a high-pressure cleaning nozzle which jets out high-pressure liquid toward said substrate at a pressure of higher than about 5 kg/cm$^2$ so as to perform high-pressure rinsing on said substrate, whereby combined rinsing is performed on the substrate by combining said ultrasonic rinsing and said high-pressure rinsing.

6. The apparatus of claim 5, further comprising c) substrate rotating device rotating said substrate in a predetermined direction, wherein said combined rinsing is performed while rotating said substrate.

7. The apparatus of claim 5, wherein said high-pressure cleaning nozzle jets out said high-pressure liquid at a pressure of between 5 kg/cm$^2$–15 kg/cm$^2$.

8. An apparatus for cleaning a substrate, comprising:
   a) an ultrasonic cleaner injecting a liquid that has been subject to an ultrasonic wave toward said substrate so as to perform ultrasonic rinsing on said substrate, said ultrasonic cleaner including an ultrasonic rinsing nozzle for injecting said liquid, which has been subject to said ultrasonic wave, through a split towards an ultrasonic rinsing line defined on a surface-to-be-cleaned of said substrate; and
   b) a high-pressure cleaner disposed at a different position from said ultrasonic cleaner, said high-pressure cleaner jetting out high-pressure liquid toward said substrate so as to perform high-pressure rinsing on said substrate, said high-pressure cleaner including an high-pressure rinsing nozzle for jetting out high-pressure liquid toward a high-pressure rinsing spot defined on said surface-to-be-cleaned of said substrate whereby combined rinsing is performed on the substrate by combining said ultrasonic rinsing and said high-pressure rinsing.

9. The apparatus of claim 1, further comprising d) high-pressure rinsing nozzle swinging means for swinging said high-pressure rinsing nozzle along a locus which passes above the center of rotation of said substrate and which is substantially parallel to a surface of said substrate.

10. The apparatus of claim 9, wherein said high-pressure rinsing spot is set at such a position in the vicinity of said ultrasonic rinsing line so as to scan said substrate before said ultrasonic rinsing line scans said substrate as said substrate is rotated.

11. The apparatus of claim 10, wherein said high-pressure rinsing spot is set shifted toward a farther one of the end points of said ultrasonic rinsing line which is farther from the center of rotation of said substrate.

12. The apparatus of claim 1, further comprising c) moving means for moving said substrate or both said ultrasonic cleaning means and said high-pressure cleaning means relative to each other, wherein rinse-scanning is performed on said substrate while performing said moving.

13. The apparatus of claim 12, further comprising d) high-pressure rinsing nozzle swinging means for swinging said high-pressure rinsing nozzle along the direction of said arrangement of said high-pressure rinsing spots.

14. The apparatus of claim 13, wherein there are a plurality of said high-pressure rinsing nozzles which are disposed on both sides of said ultrasonic rinsing nozzle, so that there are a plurality of said arrangements of said high-pressure rinsing spots which are defined on both sides of said ultrasonic rinsing line.

15. The apparatus of claim 14, wherein said ultrasonic rinsing nozzle ejects said liquid approximately perpendicularly to said surface-to-be-cleaned of said substrate, and said high-pressure rinsing nozzles each jet out said high-pressure liquid at an angle which is approximately the same or away from the direction in which said liquid is ejected from said ultrasonic rinsing nozzle.

16. The apparatus of claim 13, wherein said substrate is transported relative to said ultrasonic cleaning means and said high-pressure cleaning means in one predetermine direction, and said arrangement of said high-pressure rinsing spots are set at such positions so as to scan said substrate in said one predetermined direction before said ultrasonic rinsing line scans said substrate.

17. The apparatus of claim 16, wherein said ultrasonic rinsing nozzle ejects said liquid at an angle which is inclined toward said predetermined direction with respect to said surface-to-be-cleaned of said substrate, and of both sides of said ultrasonic rinsing nozzle, said high-pressure rinsing nozzles are disposed only on one side which corresponds to an opposite direction to said predetermined direction in which said substrate is transported, and said high-pressure rinsing nozzles each ejects said high-pressure liquid at an angle which is approximately the same or more inclined than the direction in which said liquid is ejected from said ultrasonic rinsing nozzle.

18. An apparatus for cleaning a substrate, comprising:

a) ultrasonic cleaning means for emitting an ultrasonic wave onto a liquid while injecting said liquid toward said substrate so as to perform ultrasonic rinsing on said substrate, said ultrasonic cleaning means including an ultrasonic rinsing nozzle for injecting said liquid, which is subjected to said ultrasonic wave, through a slit towards an ultrasonic rinsing line defined on a surface-to-be-cleaned of said substrate; and b) high-pressure cleaning means disposed at a different position from said ultrasonic cleaning means, said high-pressure cleaning means jetting out high-pressure liquid toward said substrate so as to perform high-pressure rinsing on said substrate, said high-pressure cleaning means including a high-pressure rinsing nozzle for jetting out high-pressure liquid towards a high-pressure rinsing spot defined on said surface-to-be-cleaned of said substrate whereby combined rinsing is performed on said substrate by combining said ultrasonic rinsing and said high-pressure rinsing.

19. The apparatus of claim 8, further comprising d) high-pressure rinsing nozzle swinging device for swinging said high-pressure rinsing nozzle along a locus which passes above the center of rotation of said substrate and which is substantially parallel to a surface of said substrate.

20. The apparatus of claim 19, wherein said high-pressure rinsing spot is set at such a position in the vicinity of said ultrasonic rinsing line so as to scan said substrate before said ultrasonic rinsing line scans said substrate as said substrate is rotated.

21. The apparatus of claim 20, wherein said high-pressure rinsing spot is set shifted toward a farther one of the end points of said ultrasonic rinsing line which is farther from the center of rotation of said substrate.

22. The apparatus of claim 8, further comprising c) a moving device moving said substrate or both said ultrasonic cleaner and said high-pressure cleaner relative to each other, wherein rinse-scanning is performed on said substrate while performing said moving.

23. The apparatus of claim 22, further comprising d) high-pressure rinsing nozzle swinging device swinging said high-pressure rinsing nozzle along the direction of said arrangement of said high-pressure rinsing spots.

24. The apparatus of claim 23, wherein there are a plurality of said high-pressure rinsing nozzles which are disposed on both sides of said ultrasonic rinsing nozzle, so that there are a plurality of said arrangements of said high-pressure rinsing spots which are defined on both sides of said ultrasonic rinsing line.

25. The apparatus of claim 24, wherein said ultrasonic rinsing nozzle ejects said liquid approximately perpendicularly to said surface-to-be-cleaned of said substrate, and said high-pressure rinsing nozzles each jet out said high-pressure liquid at an angle which is approximately the same or away from the direction in which said liquid is ejected from said ultrasonic rinsing nozzle.

26. The apparatus of claim 23, wherein said substrate is transported relative to said ultrasonic cleaner and said high-pressure cleaner in one predetermined direction, and said arrangement of said high-pressure rinsing spots are set at such positions so as to scan said substrate in said one predetermined direction before said ultrasonic rinsing line scans said substrate.

27. The apparatus of claim 26, wherein said ultrasonic rinsing nozzle ejects said liquid at an angle which is inclined toward said predetermined direction with respect to said surface-to-be-cleaned of said substrate, and of both sides of said ultrasonic rinsing nozzle, said high-pressure rinsing nozzles are disposed only on one side which corresponds to an opposite direction to said predetermined direction in which said substrate is transported, and said high-pressure rinsing nozzles each ejects said high-pressure liquid at an angle which is approximately the same or more inclined than the direction in which said liquid is ejected from said ultrasonic rinsing nozzle.

* * * * *

UNITED STATES PATENT AND TRADEMARK OFFICE
CERTIFICATE OF CORRECTION

PATENT NO.   : 5,975,098
DATED        : November 2, 1999
INVENTOR(S)  : Yoshitani, et al.

It is certified that error appears in the above-indentified patent and that said Letters Patent is hereby corrected as shown below:

In line 1 of claim 12:

please change "1" to --18--.

Signed and Sealed this

Twenty-third Day of May, 2000

Attest:

Q. TODD DICKINSON

Attesting Officer      Director of Patents and Trademarks